US006529750B1

(12) United States Patent
Zhang et al.

(10) Patent No.: US 6,529,750 B1
(45) Date of Patent: Mar. 4, 2003

(54) MICROSTRIP FILTER CROSS-COUPLING CONTROL APPARATUS AND METHOD

(75) Inventors: Dawei Zhang, Saratoga, CA (US); Ji-Fuh Liang, Sunnyvale, CA (US); Chien-Fu Shih, Sunnyvale, CA (US)

(73) Assignee: Conductus, Inc., Sunnyvale, CA (US)

( * ) Notice: Subject to any disclaimer, the term of this patent is extended or adjusted under 35 U.S.C. 154(b) by 0 days.

(21) Appl. No.: 09/285,350

(22) Filed: Apr. 2, 1999

Related U.S. Application Data

(63) Continuation-in-part of application No. 09/054,912, filed on Apr. 3, 1998, now abandoned.

(51) Int. Cl.[7] .......................... H03H 7/01; H01B 12/02

(52) U.S. Cl. ...................... 505/210; 505/700; 505/866; 333/185; 333/204

(58) Field of Search ............................... 333/995, 204, 333/219, 185, 168, 175; 505/210, 700, 701, 866

(56) References Cited

U.S. PATENT DOCUMENTS 3,656,162 A 4/1972 Mee
4,418,324 A 11/1983 Higgins
4,423,396 A 12/1983 Makimoto et al.
4,513,263 A 4/1985 Minnis
4,881,050 A 11/1989 Swanson, Jr.
4,992,759 A 2/1991 Giraudeau et al.
5,132,282 A 7/1992 Newman et al.
5,231,078 A 7/1993 Riebman et al.
5,416,454 A 5/1995 McVeety
5,525,942 A * 6/1996 Horii et al. ............ 333/204 X
5,616,539 A 4/1997 Hey-Shipton et al.
5,618,777 A 4/1997 Hey-Shipton et al.
5,888,942 A 3/1999 Malthaei
6,122,533 A * 9/2000 Zhang et al. .............. 333/995

FOREIGN PATENT DOCUMENTS

DE 23 17 375 10/1974
DE 4 009 076 9/1991
EP 0 350 256 A2 1/1990
FR 2 577 067 8/1986
JP 57 97 715 6/1982
JP 4 072 804 3/1992
WO WO 96/12320 4/1996
WO WO 99/52171 10/1999

OTHER PUBLICATIONS

Field, P. L., et al., "Asymmetric Bandpass Filter Using a Novel Microstrip Circuit," *IEEE Microwave and Guided Wave Letters*, vol. 2, No. 6, pp. 247–249 (Jun. 1992).

Aitchison, C.S. et al., "Lumped–circuit elements at microwave frequencies" See Fig. 3B, *IEEE Transactions on Microwave Theory and Techniques*, 19(12):928–937, (Dec. 1971).

Chaloupka, H., "High–Temperature Superconductors—A Material for Miniaturized or High–Performance Microwave Components", *Fequenz*, vol. 44, No. 5, pp. 141–144 (May 1990).

(List continued on next page.)

*Primary Examiner*—Benny T. Lee
(74) *Attorney, Agent, or Firm*—Merchant & Gould P.C.

(57) ABSTRACT

The present invention provides for a method and apparatus to control non-adjacent cross-coupling in a micro-strip filter. In instances of weak cross-coupling, such as a filter circuit on a high dielectric constant substrate material (e.g., $LaAIO_3$ with dielectric constant of 24), a closed loop is used to inductively enhance the cross-coupling. The closed loop increases the transmission zero levels. For strong cross-coupling cases, such as a filter circuit on a lower dielectric constant substrate material (e.g., MgO with dielectric constant of 9.6), a capacitive cross-coupling cancellation mechanism is introduced to reduce the cross-coupling. In the latter instance, the transmission zero levels are moved down.

25 Claims, 27 Drawing Sheets

Cross-coupling cancellation

OTHER PUBLICATIONS

Fathy, A., et al., "Critical Design Issues in Implementing a YBCO Superconductor X–Band Narrow Bandpass Filter Operating at 77K", *IEEE MTT–S Digest* pp. 1329–1332 (1991).

Fathy, A., et al., "Superconducting Narrow Band Pass Filters For Advanced Multiplexers", *IEE MIT–S Digest*, pp. 1277–1280 (1993).

Hammond, R.B. et al., "Designing with superconductors", See p. 36, left column, line 29–line 35, *IEEE Spectrum* 30(4):34–39 (Apr. 1993) New York US.

Hong, J. et al., "Theory and Experiment of Novel Microstrip Slow–Wave Open–Loop Resonator Filtes", *IEEE Transactions on Microwave Theory and Techniques*, vol. 45, No. 12, pp. 2358–2365 (Dec. 1997).

Morgan, D., et al., "Lumped Element Filters for Electronic Warfare Systems", *Microwave Journal*, pp. 127–136 (Feb. 1986).

Nagai, Y. et al., "Properties of superconductive bandpass filters with thermal switches" See p. 830, left column, line 17–line 30, *Applied Physics Letters* 63(6):830–832 (Aug. 9, 1993) New York, US.

Newman, N. , et al., "High–Temperature Superconducting Mcirowave Devices: Fundamental Issues in Materials, Physics, and Engineering", *Journal of Superconductivity* 6(3):119–160 (1993).

Patzelt, T. et al., "High–temperature superconductive lumped–element microwave allpass sections" See p. 1579, left column, line 37–line 42; Fig. 1, *Electronics Letters* 29(17):1578–1580, (Aug. 19, 1993) Stevenage GB.

Swanson, D., "Thin–Film Lumped–Element Microwave Filters", *IEEE MTT–S Digest*, pp. 671–674 (1989).

Swanson, Jr., D., et al., "A 10 GHz Thin Film Lumped Element High Temperature Superconductor Filter", *IEEE MTT–S Digest*, pp. 1191–1193 (1992).

U.S. application Ser. No. 08/706,974, filed Sep. 3, 1996, which is a FWC of U.S. application Ser. No. 08/323,365, filed Oct. 14, 1994, now abandoned.

Zhang, D. et al., "Narrowband lumped–element microstrip filters using capacitively–loaded inductors", *IEEE MTT–S International Microwave Symposium—Digest* 2(16–20):379–382 (May 1995).

Zhang, D. et al., "Microstrip Filters For Wireless Communications Using High–Temperature Superconducting Thin Films", *Applied Superconductivity* 5(3):483–496, 1995 Copyright © 1996 Elsevier Science Ltd.

* cited by examiner

13B
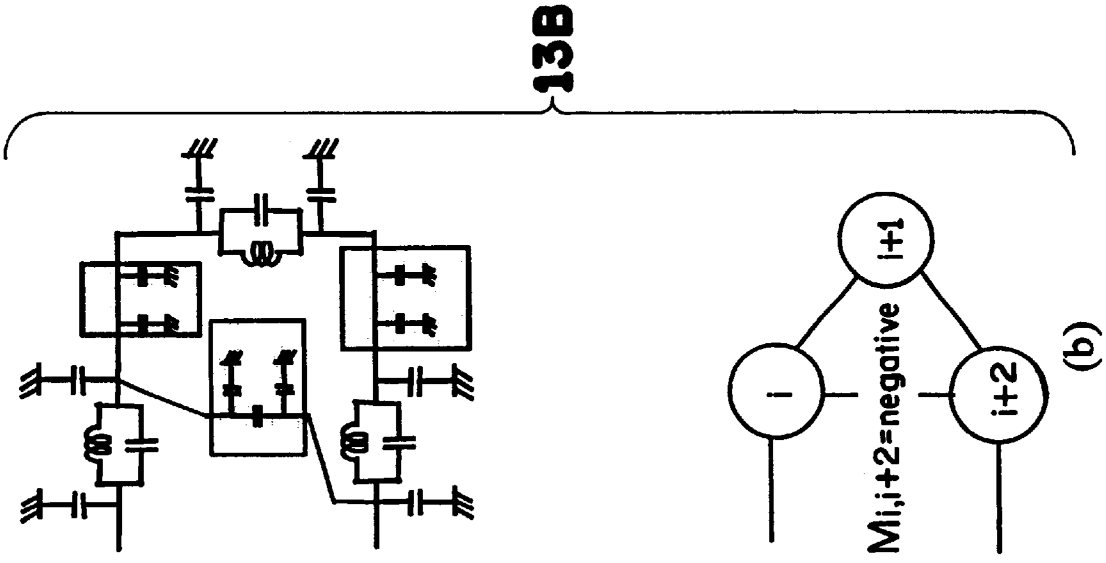
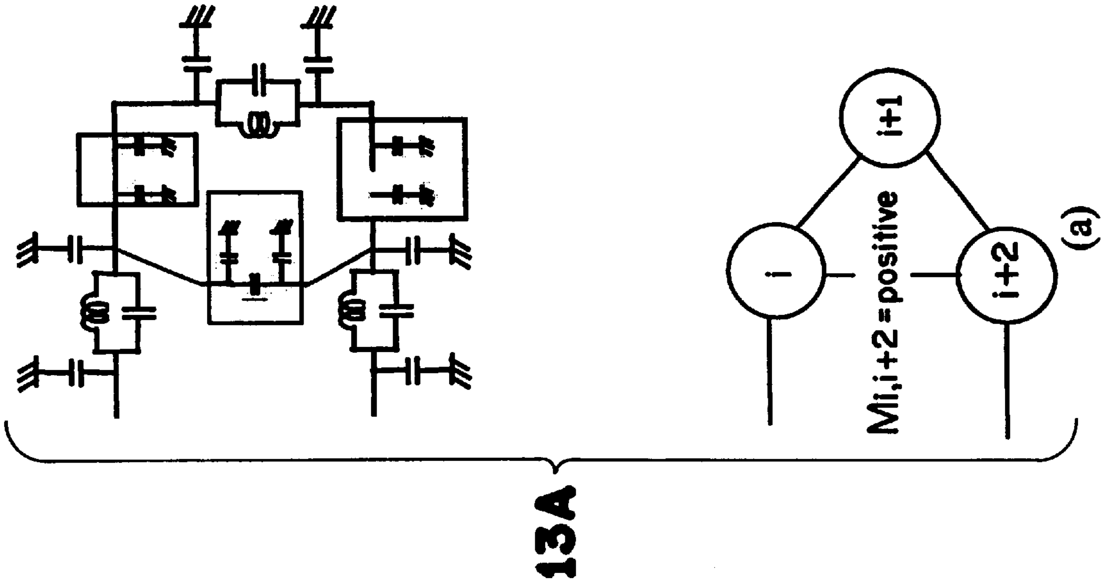
13A

FIG. 18A
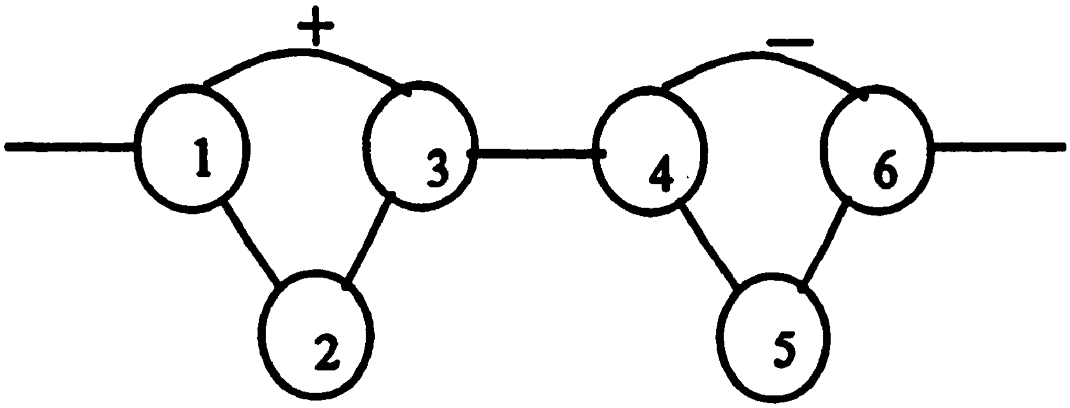
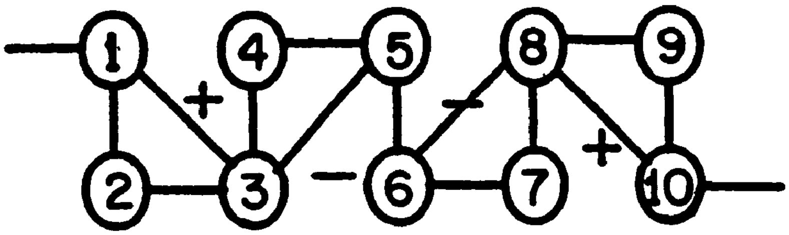
FIG. 19A

MICROSTRIP FILTER CROSS-COUPLING CONTROL APPARATUS AND METHOD

RELATED APPLICATIONS

This is a continuation-in-part of Zhang, U.S. Ser. No. 09/054,912, filed Apr. 3, 1998, now abandoned.

FIELD OF THE INVENTION

The present invention relates generally to filters for electrical signals, more particularly to control of cross-coupling in narrowband filters, and still more particularly to methods and apparatus to control the placement of transmission zeroes when introducing cross-coupling between non-adjacent resonators in a narrowband filter.

BACKGROUND

Narrowband filters are particularly useful in the communications industry and particularly for wireless communications systems which utilize microwave signals. At times, wireless communications have two or more service providers operating on separate bands within the same geographical area. In such instances, it is essential that the signals from one provider do not interfere with the signals of the other provider(s). At the same time, the signal throughput within the allocated frequency range should have a very small loss.

Within a single provider's allocated frequency, it is desirable for the communication system to be able to handle multiple signals. Several such systems are available, including frequency division multiple access (FDMA), time division multiple access (TDMA), code division multiple access (CDMA), and broad-band CDMA (b-CDMA). Providers using the first two methods of multiple access need filters to divide their allocated frequencies in the multiple bands. Alternatively, CDMA operators might also gain an advantage from dividing the frequency range into bands. In such cases, the narrower the bandwidth of the filter, the closer together one may place the channels. Thus, efforts have been previously made to construct very narrow bandpass filters, preferably with a fractional-band width of less than 0.05%.

An additional consideration for electrical signal filters is overall size. For example, with the development of wireless communication technology, the cell size (e.g., the area within which a single base station operates) will get much smaller—perhaps covering only a block or even a building. As a result, base station providers will need to buy or lease space for the stations. Since each station requires many separate filters, the size of the filter becomes increasingly important in such an environment. It is, therefore, desirable to minimize filter size while realizing a filter with very narrow fractional-bandwidth and high quality factor Q. In the past, however, several factors have limited attempts to reduce the filter size.

For example, in narrowband filter designs, achieving weak coupling is a challenge. Filter designs in a microstrip configuration are easily fabricated. However, very narrow bandwidth microstrip filters have not been realized because coupling between the resonators decays only slowly as a function of element separation. Attempts to reduce fractional-bandwidth in a microstrip configuration using selective coupling techniques have met with only limited success. The narrowest fractional-bandwidth reported to date in a microstrip configuration was 0.6%. Realization of weak coupling by element separation is ultimately limited by the feedthrough level of the microstrip circuit.

Two other approaches have been considered for very-narrow-bandwidth filters. First, cavity type filters may be used. However, such filters are usually quite large. Second, filters in stripline configurations may be used, but such devices are usually hard to package. Therefore, by utilizing either of these two types of devices there is an inevitable increase in the final system size, complexity and the engineering cost.

If a quasi-elliptical filter response is desired, it will be appreciated that transmission zeroes on both sides of the passband may be used to enhance the filter skirt rejections. For fewer poles and less Q requirements, a quasi-elliptical filter can achieve similar skirt rejections compared to a Chebyshev filter. FIG. 5*a* illustrates a simulated response of a 12-pole quasi-elliptical filter compared to a Chebyshev filter.

One method of achieving a quasi-elliptical filter response is to introduce a cross-coupling between two or more specific non-adjacent resonators. In microstrip filter designs, the separation(s) of non-adjacent resonators and the dielectric properties of the substrate determine the strength of the cross-coupling. If the layout topology of the filter is constructed such that desired non-adjacent resonators are close together, then the cross-coupling of such non-adjacent resonators can introduce transmission zeroes on both sides of the filter transmission. This results in the layout providing a beneficial parasitic effect in the quasi-elliptical filter response.

However, in the past the introduction of such non-adjacent cross-coupling has not been easily controlled. For example, depending upon the required filter size, number of poles and substrate choice, the transmission zeroes may not be provided at the appropriate location. Thus, at times the cross-coupling may not be large enough—such that the transmission zeroes are at very low levels. At other times, the cross-coupling is too large, such that the transmission zeroes are at very high level—which interferes with passband performance.

Therefore, there exists a need for a super-narrow-bandwidth filter having the convenient fabrication advantage of microstrip filters while achieving, in a small filter, the appropriate non-adjacent cross-coupling necessary to introduce transmission zeroes which provides an optimized transmission response of the filter.

SUMMARY OF THE INVENTION

The present invention provides for a method and apparatus to control non-adjacent cross-coupling in a micro-strip filter. In instances of weak cross-coupling, such as a filter circuit on a high dielectric constant substrate material (e.g., $LaAlO_3$ with dielectric constant of 24), a closed loop is used to inductively enhance the cross-coupling. The closed loop increases the transmission zero levels. For strong cross-coupling cases, such as a filter circuit on a lower dielectric constant substrate material (e.g., MgO with dielectric constant of 9.6), a capacitive cross-coupling cancellation mechanism is introduced to reduce the cross-coupling. In the latter instance, the transmission zero levels are moved down.

In the preferred embodiment, the present invention is used in connection with a super-narrow band filter using frequency dependent L-C components (such as are described in Zhang, et al. U.S. Ser. No. 08/706,974 which is hereby incorporated herein and made a part hereof by reference). The filter utilizes a frequency dependent L-C circuit with a positive slope k for the inductor values as a function of frequency. The positive k value allows the realization of a very narrow-band filter. Although this filter environment and its topology is used to describe the present invention, such environment is used by way of example, and the invention might be utilized in other environments (for example, other filter devices with non-adjacent resonator devices, such as lumped element quasi-elliptical filters). Further, the environments of communications and wireless technology are used herein by way of example. The principles of the present invention may be employed in other environments as well. Accordingly, the present invention should not be construed as limited by such examples.

As noted above, there have been previous attempts to utilize non-adjacent parasitic coupling to introduce transmission zeroes in filters. However, such efforts have generally been provided purely as a parasitic effect without control. One example of such an attempt is described in S. Ye and R. R. Mansour, DESIGN OF MANIFOLD-COUPLED MULTIPLEXERS USING SUPERCONDUCTIVE LUMPED ELEMENT FILTERS, p. 191, IEEE MTT-S Digest (1994). Still other techniques have been developed to artificially add non-adjacent cross-couplings. Here the efforts have generally introduced transmission zeroes using a properly phased transmission line. Examples of these latter efforts may be found in S. J. Hedges and R. G. Humphreys, EXTRACTED POLE PLANAR ELLIPTICAL FUNCTION FILTERS, p. 97; and U.S. Pat. No. 5,616,539, issued to Hey-Shipton et al. None of these efforts, however, provide the precise cross-coupling control and flexibility to optimize the filter performance.

Referring more specifically to the device disclosed in the Hey-Shipton patent, conductive elements between non-adjacent capacitor pads in a multi-element lumped element filter are disclosed (see e.g., FIG. 13 of that reference). The linear arrangement of the resonators limits the number of elements realizable on a small substrate, while the phase requirements of the connecting line constrain cross-coupling. In addition, the Hey-Shipton patent does not disclose or teach any cancellation approach.

Therefore, one feature of the present invention is that it provides a method and apparatus for cancellation techniques to control the location of the transmission zeroes (or decrease the cross-coupling). Another feature is providing the use of a closed loop to enhance the cross-coupling. By providing means to increase or decrease cross-coupling, control over non-adjacent resonator device cross-coupling is accomplished, and transmission response of the filter is optimized.

In a preferred embodiment of the invention, in order to increase cross-coupling of non-adjacent elements, a closed loop coupling element is provided there between. In a second preferred embodiment of the invention, in order to decrease cross-coupling of non-adjacent elements, series capacitive elements are provided to cancel (or control) excessive inductive cross-coupling.

Therefore, according to one aspect of the invention, there is provided a filter for an electrical signal, comprising: at least one pair of non-adjacent resonator devices in a micro-strip topology; and a cross-coupling control element between the at least one pair of non-adjacent resonator devices, wherein transmission response of the filter is optimized.

According to another aspect of the invention, there is provided a bandpass filter, comprising: a plurality of L-C filter elements, each of said L-C filter elements comprising an inductor and a capacitor in parallel with the inductor; a plurality of Pi-capacitive elements interposed between the L-C filter elements, wherein a lumped-element filter is formed with at least two of the L-C filter elements being non-adjacent one another; and means for controlling cross-coupling between the non-adjacent L-C filter elements, wherein quasi-elliptical filter transmission response is achieved.

According to yet another aspect of the invention, there is provided a method of controlling cross-coupling in an electric signal filter, comprising the steps of: connecting a plurality of L-C filter elements, each of the L-C filter elements comprising an inductor and a capacitor in parallel with the inductor; interposing a Pi-capacitive element between each of the L-C filter elements, wherein a lumped-element filter is formed with at least two of the L-C filter elements being non-adjacent one another; and inserting between the non-adjacent L-C filter elements a means for controlling cross-coupling between the non-adjacent L-C filter elements, wherein quasi-elliptical filter transmission response is achieved.

According to yet another aspect of the invention, there is provided a filter for an electrical signal, comprising: at least one pair of non-adjacent resonator devices in a micro-strip topology, wherein there is only a resonator device between the at least one pair of non-adjacent resonator devices; and a cross-coupling element between the at least one pair or non-adjacent resonator devices, wherein the transmission response of the filter is optimized.

According to another aspect of the invention, there is provided a method of controlling cross-coupling in an electric signal filter, comprising the steps of: connecting a plurality of L-C filter elements, each of the L-C filter elements comprising an inductor and a capacitor in parallel with the inductor; interposing a Pi-capacitive element between each of the L-C filter elements, wherein a lumped-element filter is formed with at least two of the L-C filter elements being non-adjacent one another and with only one L-C filter element between the two non-adjacent L-C filter elements; and inserting between the at least two non-adjacent L-C filter elements a cross-coupling element, wherein the transmission response of the filter is optimized.

These and other advantages and features which characterize the present invention are pointed out with particularity in the claims annexed hereto and forming a further part hereof. However, for a better understanding of the invention, the advantages and objects attained by its use, reference should be made to the drawings which form a further part hereof, and to the accompanying descriptive matter, in which there is illustrated and described preferred embodiments of the present invention.

BRIEF DESCRIPTION OF THE DRAWINGS

In the Drawings, wherein like reference numerals and letters indicate corresponding like elements throughout the several views:

FIG. 13*a* is a schematic of a tri-section with positive cross-coupling for HTS microstrip Pi-resonators.

FIG. 13*b* is a schematic of a tri-section with negative cross-coupling for HTS microstrip Pi-resonators.

FIG. 18*a* illustrates the cross-coupling scheme of a 6-pole quasi-elliptic function filter.

FIG. 19*a* illustrates the cross-coupling scheme of a 10-pole quasi-elliptic function filter.

DETAILED DESCRIPTION OF THE INVENTION

The principles of this invention apply to the filtering of electrical signals. The preferred apparatus and method of the present invention provides for control of placement of transmission zeroes to provide greater skirt rejection and optimize the transmission response curve of the filter. Means are provided to increase or decrease the cross-coupling between non-adjacent resonator elements in order to control the zeroes.

As noted above, a preferred use of the present invention is in communication systems and more specifically in wireless communications systems. However, such use is only illustrative of the manners in which filters constructed in accordance with the principles of the present invention may be employed.

Figure 1:
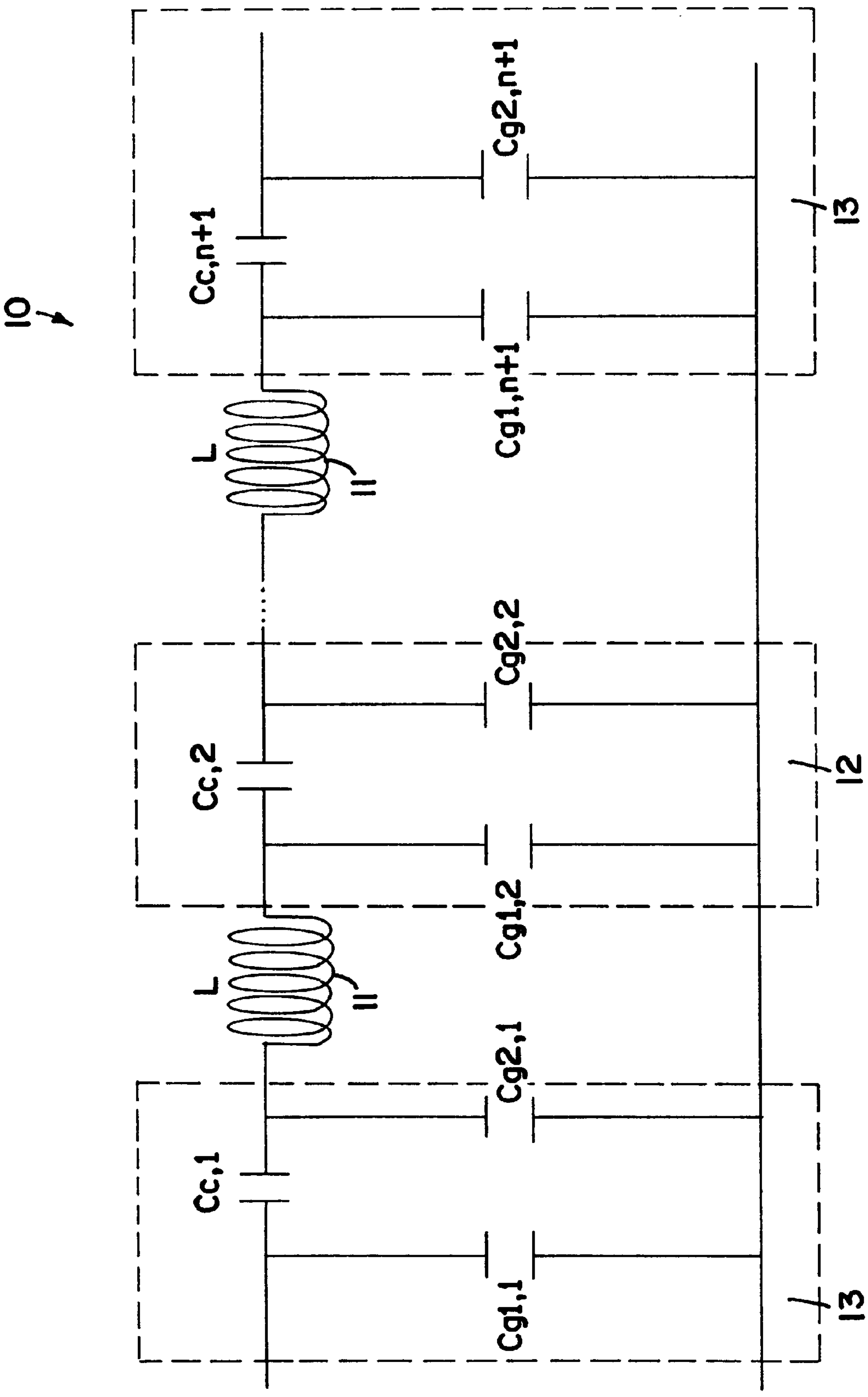
FIG. 1 is a circuit model of an nth-order lumped-element bandpass filter showing the structure with all the inductors transformed to the same inductance value.
Figure 2:
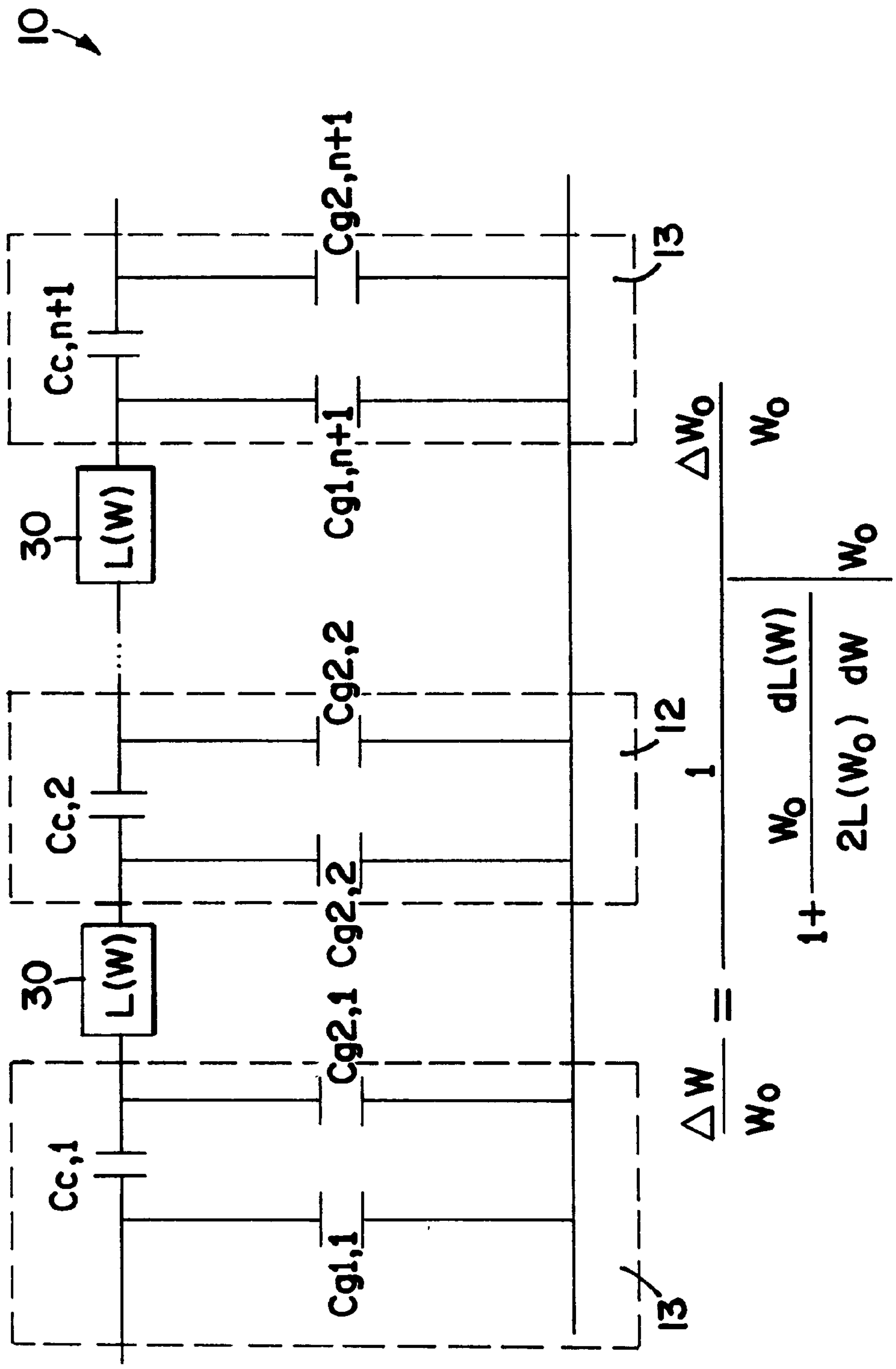
FIG. 2 is a circuit model of an nth-order lumped-element bandpass filter with the L-C filter element apparatus shown as $L'(\alpha)$.

The preferred environment filter in which the present invention may be employed includes the utilization of frequency-dependent L-C components and a positive slope of inductance relative to frequency. That is, the effective inductance increases with increasing frequency. FIGS. 1 and 2 illustrate a Pi-capacitor network 10 in which such frequency dependent L-C components may be used. In FIGS. 1 and 2, n inductive elements and connected alternately with n+1 Pi-capacitive elements. Within the ith Pi-capacitive element (12, 13 in FIG. 1 or 2), a coupling capacitor $C_{c,i}$ is connected in series with the inductive elements; two shunt capacitors $C_{gi,1}$ and $C_{gi,2,}$ are connected from the respective ends of the coupling capacitor to ground. Such networks will be appreciated by those of skill in the art and so will not be discussed in great detail herein. Generally referring to FIG. 1, the schematic Pi-capacitor building block 10 is illustrated. The circuit is comprised of capacitive elements 12 with an inductive element 11 located therebetween. A capacitive element 13 is used at the input and output to match appropriate circuit input and output impedances. FIG. 1 illustrates the case in which each of the inductive elements are established at a similar inductance L. In FIG. 2, an inductor device 30 is utilized which is frequency dependent. Accordingly, the inductance becomes L(ω) and the resulting L-C filter element (shown best in FIG. 2) is L'(ω). The use of frequency dependent inductor with a positive slope in the frequency domain (dL'(ω/dω) results in a narrower bandwidth:

$$\frac{\Delta\omega}{\omega_0} = \frac{1}{1 + \frac{\omega_0}{2L}\frac{dL'(\omega)}{d\omega}\Big|_{\omega_0}}\frac{\Delta\omega_0}{\omega_0}$$

where $\omega_0$ is the filter center frequency, $\Delta\omega/\omega_0$ is the bandwidth with the frequency-dependent inductor, and $\Delta\omega_0/\omega_0$ is the bandwith with a frequency-independent inductor L.

Figure 3:
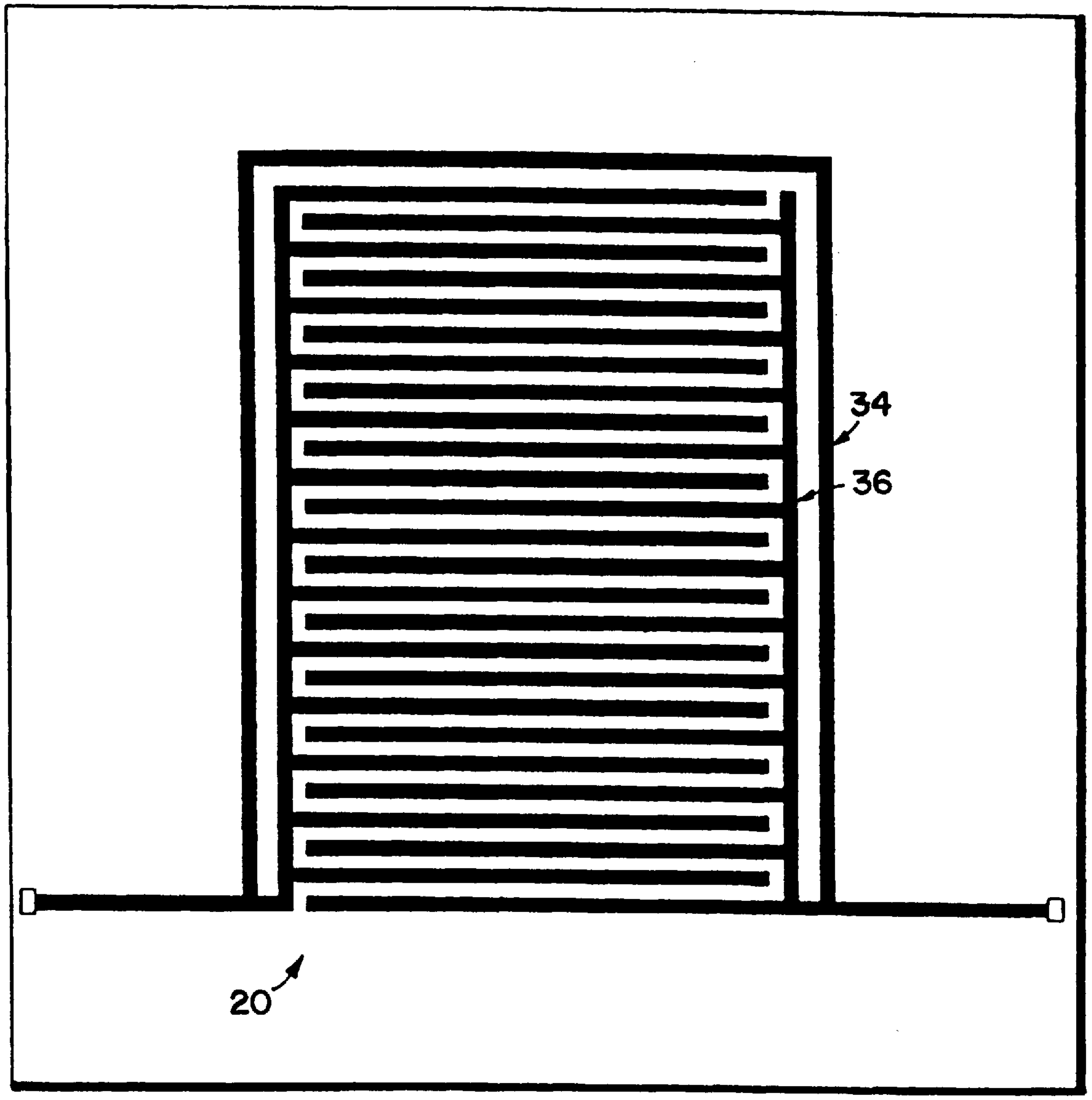
FIG. 3 is an example of a layout of a frequency-dependent inductor realization.
Figure 4:
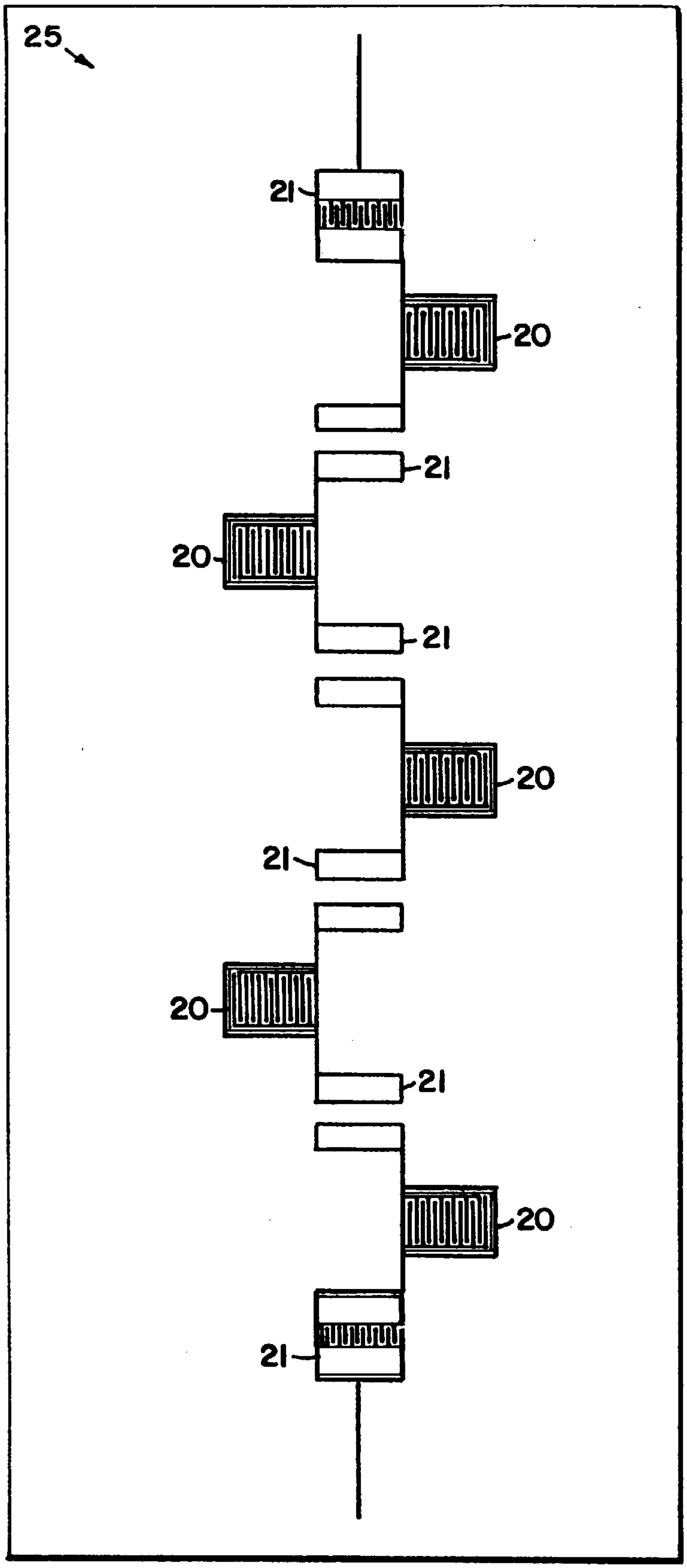
FIG. 4 illustrates a realization of lumped-element filters without cross-coupling.

FIG. 3 illustrates the L-C filter element 20 which is comprised of an interdigital capacitive element 36 and a half-loop inductive element 34. FIG. 4 illustrates a strip-line topology in which Pi-capacitor network 25 is formed of L-C filter elements 20 and capacitor devices 21. In the preferred embodiment of the present invention, this topology may then be modified to locate non-adjacent elements nearer to one another as will be described in more detail below.

The filter devices of the invention are preferably constructed of materials capable of yielding a high circuit Q filter, preferably a circuit Q of at least 10,000 and more preferably a circuit Q of at least 40,000. Superconducting materials are suitable for high Q circuits. Superconductors include certain metals and metal alloys, such a niobium as well as certain Perovskite oxides, such as $YBa_2Cu_3O_{7-\delta}$ (YBCO), where $\delta$ denotes oxygen vacancy concentration. Methods of deposition of superconductors on substrates and of fabricating devices are well known in the art, and are similar to the methods used in the semiconductor industry.

In the case of high temperature oxide superconductors of the Perovskite-type, deposition may be by any known method, including sputtering, laser ablation, chemical deposition or co-evaporation. The substrate is preferably a single crystal material that is lattice-matched to the superconductor. Intermediate buffer layers between the oxide superconductor and the substrate may be used to improve the quality of the film. Such buffer layers are known in the art, and are described, for example, in U.S. Pat. No. 5,132,282 issued to Newman et al., which is hereby incorporated herein by reference. Suitable dielectric substrates for oxide superconductors include sapphire (single crystal $Al_2O_3$), lanthanum aluminate ($LaAlO_3$), magnesium oxide (MgO) and yttrium stabilized zirconium (YSZ).

Figure 5A:
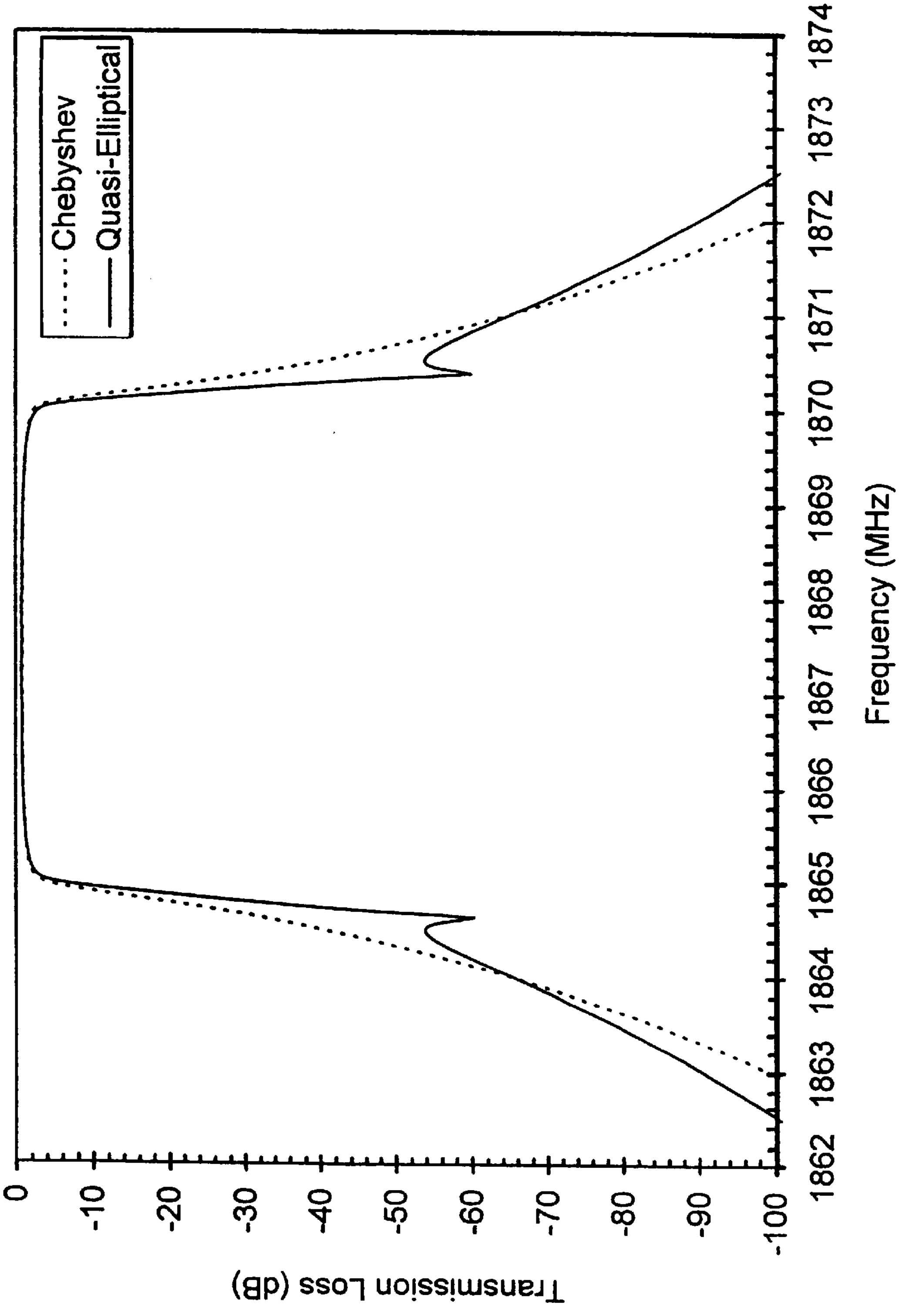
FIG. 5*a* illustrates the simulation response of a twelve (12) pole filter for both a Chebyshev realization and a Quasi-Elliptical realization.
Figure 5B:
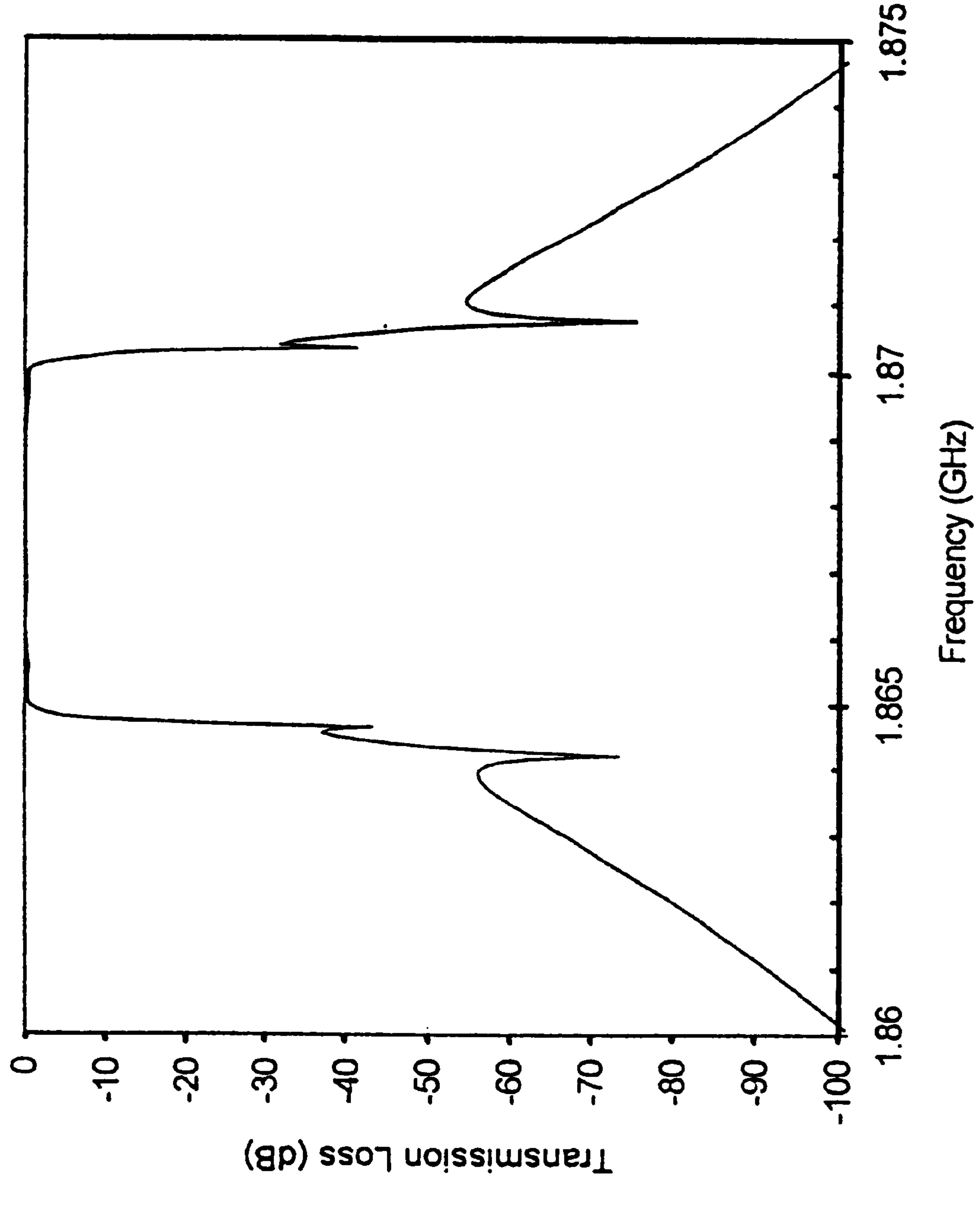
FIG. 5*b* is a graph showing quasi-elliptical performance which enhances filter skirt-rejection.

Turning now to FIG. 5*b*, a graphical representation of the quasi-elliptical performance enhancement showing improved filter skirt-rejection is illustrated. Compared to a response curve shown in FIG. 5*a*, the response curve shown in FIG. 5*b* contains more notches as the result of a filter having more zeros. FIG. 5*b* illustrates that the transmission zeroes (or notches) provide sharper skirt rejection with fewer poles needed. Additionally, such performance requires lower loss or less Q.

Utilizing these principles in a micro-strip design, the cross-coupling of the non-adjacent resonator devices may beneficially provide zeroes which introduce the quasi-elliptical performance. However, by controlling the placement of zeroes, transmission response is improved to further optimize the filter performance.

Figure 6:
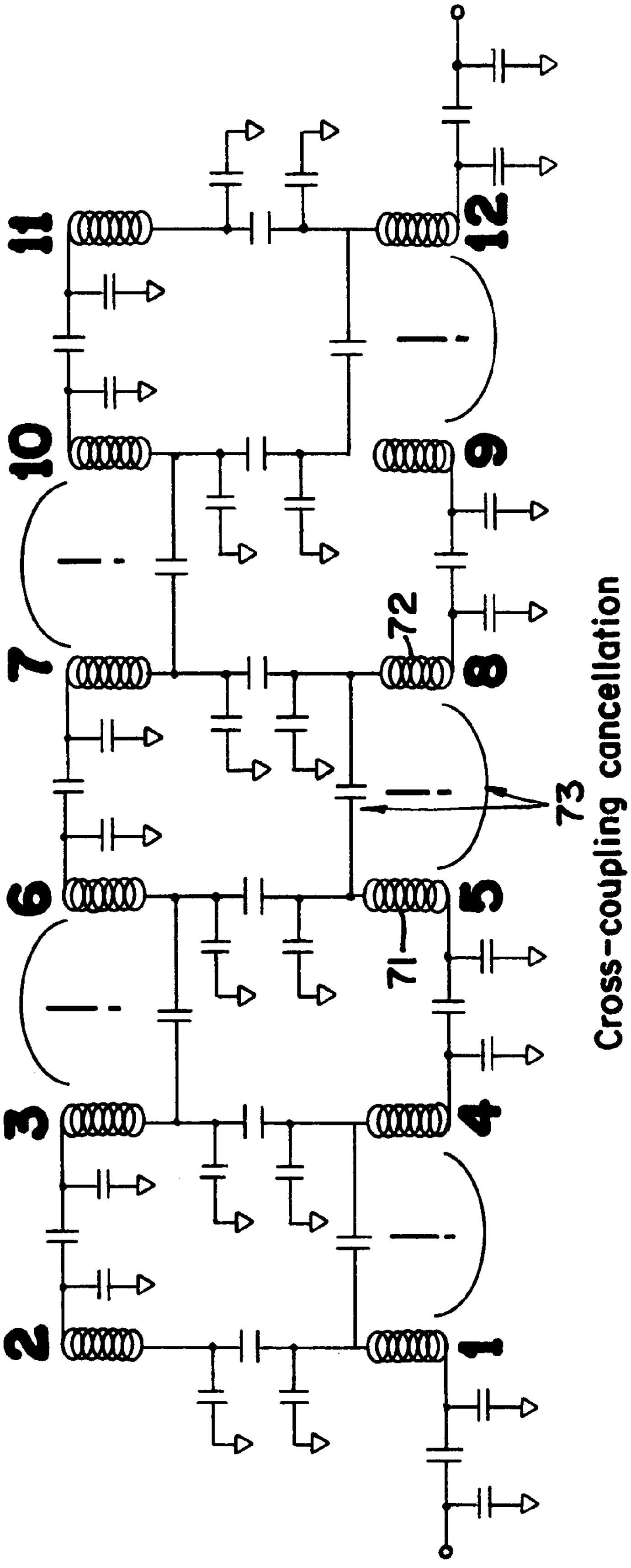
FIG. 6 illustrates a schematic representation of a device which includes cross-coupling cancellation by providing a series capacitive device between non-adjacent resonator devices.

FIG. 6 illustrates that in the event there is too much cross-coupling, then a capacitive cross-coupling technique may be employed between non-adjacent resonator devices. In FIG. 6, there are schematically illustrated series capacitors 73 located between non-adjacent resonator devices 71 and 72. Those of skill in the art will appreciate that there are five pairs of non-adjacent resonators in FIG. 6. However, only one pair of non-adjacent resonator devices 71 and 72, as well as one series capacitance 73, is specifically marked with numerical designations.

Figure 7A:
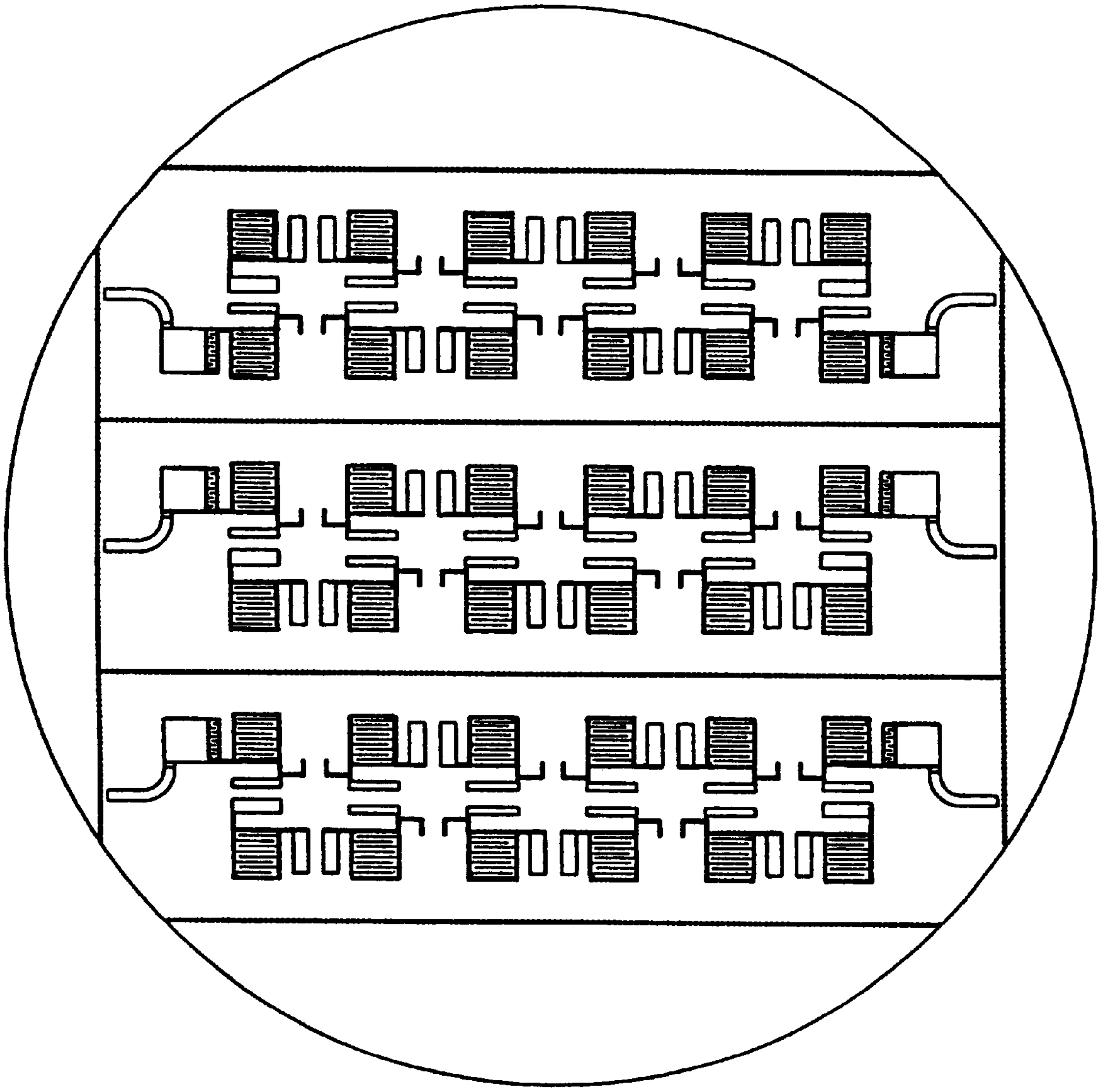
FIG. 7*a* shows a layout of an HTS quasi-elliptical filter on an MgO substrate utilizing cross-coupling cancellation.

FIG. 7*a* illustrates more specifically a topology of an HTS quasi-elliptical filter on an MgO substrate in which cross-coupling cancellation may be employed. A filter 700 includes a string of resonator elements, as typified by resonator elements 71 and 72, arranged in a zig-zag patern between the input 710 and output 720. This MgO substrate may have a dielectric constant of 9.6. Depending on distance between the devices, additional capacitance between the non-adjacent devices to cancel cross-coupling may improve the filter performance.

Figure 7B:
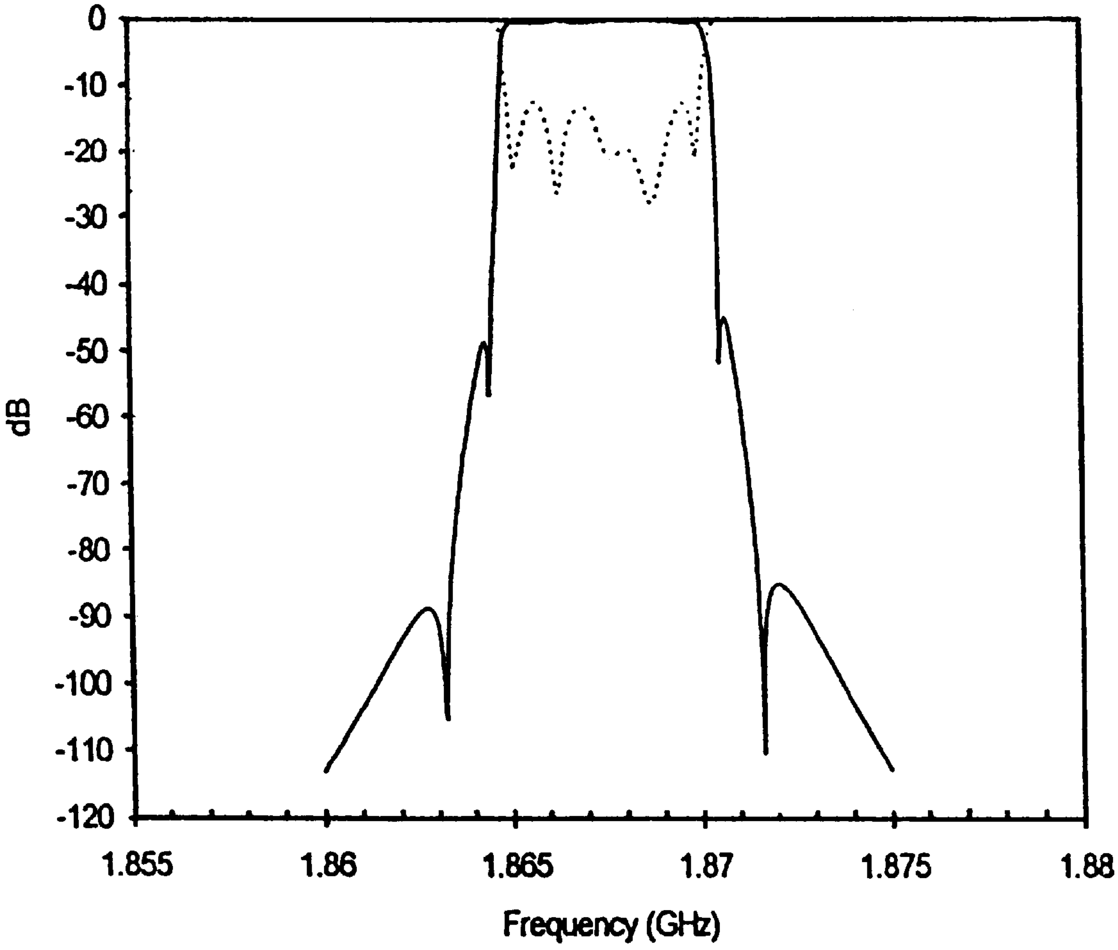
FIG. 7*b* is an illustrative graph showing the transmission response of FIG. 7*a* with capacitive devices for cancelling (controlling) cross-coupling.

Resonator elements 71 and 72 normally include cross-coupling due to their proximity to one another. In order to cancel (or control) cross-coupling, series capacitor 73 is inserted into that area located between the elements 71 and 72. FIG. 7*b* illustrates the filter response of a PCS D-Block (5 MHz) filter with cross-coupling. Representative specifications for such a filter include a filter passband frequency of 1865–1870 MHZ, with a 60 dB rejection at 1 MHZ from the band edge.

As an example circuit, all inductors are identical within the filter with 100 micron linewidth. All interdigital capacitor fingers are 50 microns wide. Equivalent inductance of this capacitively-loaded circuit is about 12 nanoHenries at 1.6 GHz. The whole filter structure may be fabricated on a MgO substrate with a dielectric constant of about 10. The substrate is about 0.5 millimeter thick. Other substrates also used in this type of filters could be lanthanum aluminate and sapphire.

The YBCO is typically deposited on the substrate using reactive co-evaporation, but sputtering and laser albation could also be used. A buffer layer may be used between the substrate and the YBCO layer, especially if sapphire is the substrate. Photolithography is used to pattern the filter structure.

Figure 8B:
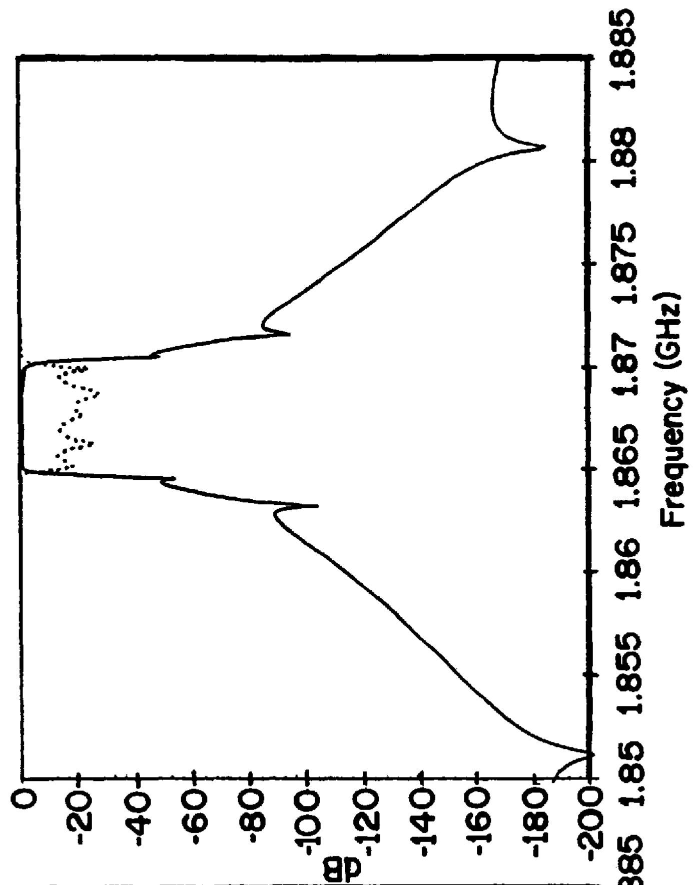
FIGS. 8*a* and 8*b* illustrate filter performance on MgO substrates without cross-coupling cancellation and with cross-coupling cancellation, respectively.
Figure 8A:
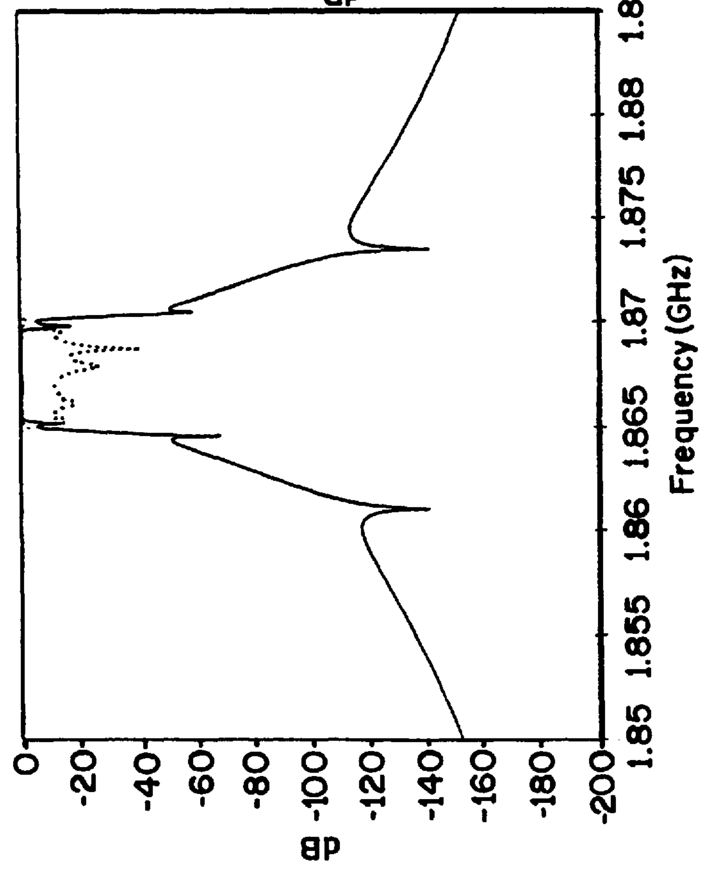

FIGS. 8*a* and 8*b* illustrate (for comparison) filter performance on MgO substrates without cross-coupling cancellation (FIG. 8*a*) and with cross-coupling cancellation (FIG. 8*b*). The filter response peak for the filter with cross-coupling cancellation (FIG. 8*b*) is better defined than that without the cancellation (FIG. 8*a*).

Figure 9:
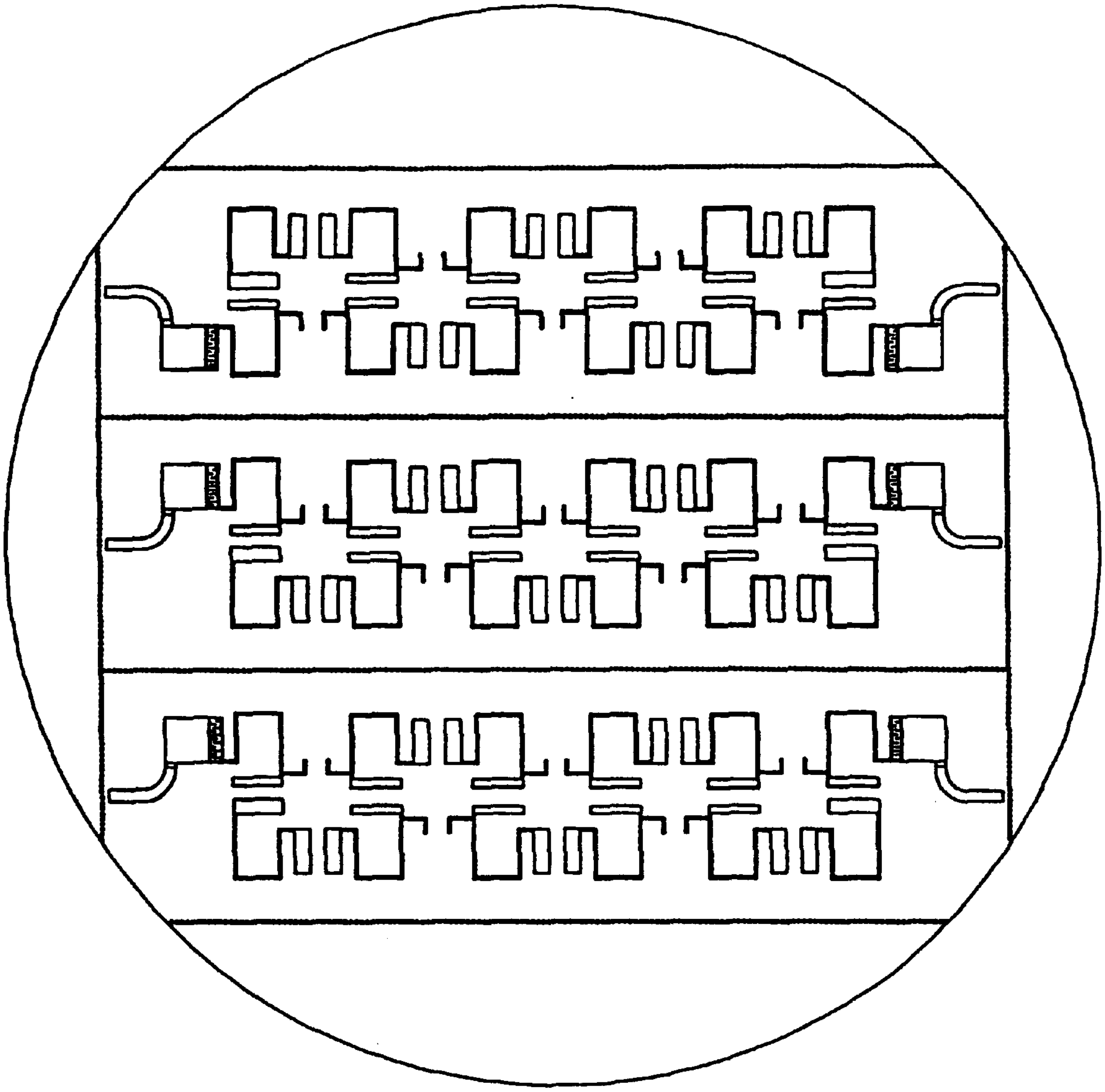
FIG. 9 shows a layout utilizing a lumped element filter with cross-coupling cancellation, which layout does not include parallel L-C frequency-dependant inductors.

As will be apparent to those of skill in the art, the principles of cross-coupling may be used in environments in which frequency transformation inductive elements are not employed. For example, FIG. 9 illustrates a representative arrangement of a lumped element filter 900 utilizing cross-coupling cancellation 73 (without frequency dependent inductors; the inductors, examples of which are labeled as 910 and 920 in FIG. 9, are simple inductive half-loops.)

Figure 10A:
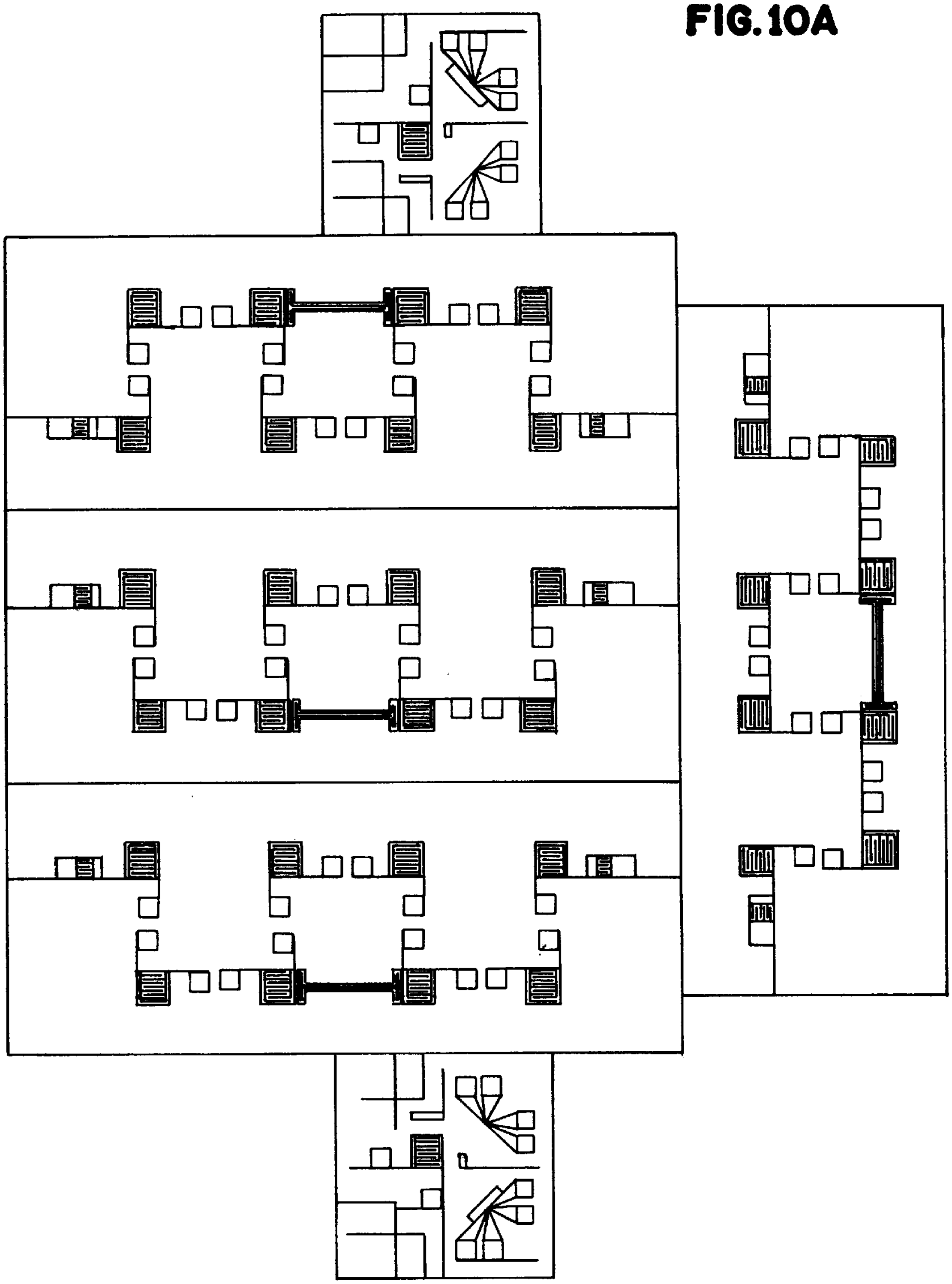
FIG. 10*a* illustrates the topology of an HTS filter on an $LaAlO_3$ substrate utilizing cross-coupling enhancement.
Figure 10B:
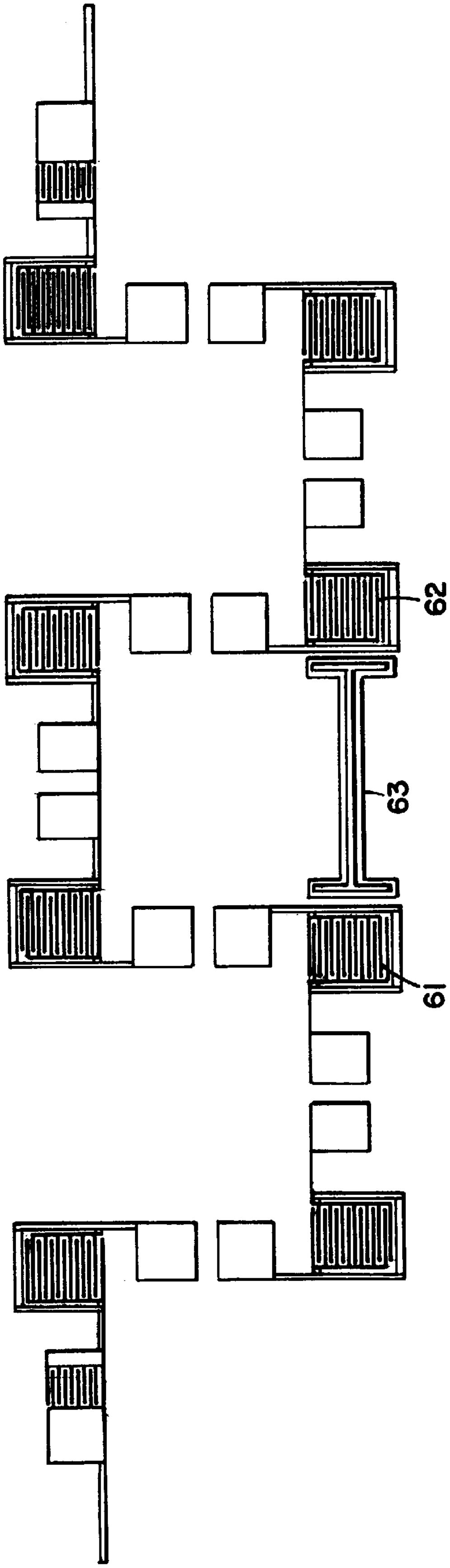
FIG. 10*b* is an enlarged area of FIG. 10*a* illustrating the closed loop between non-adjacent resonator elements.

Turning now to FIGS. 10*a* and 10*b*, an HTS filter laid out on an $LaAlO_3$ substrate is illustrated. Since this substrate exhibits a high dielective constant, cross-coupling is generally low (based in part on distance between the devices). Therefore, in this type of arrangement, cross-coupling enhancement may be necessary to optimize the filter performance.

FIG. 10*b* shows an enlarged area 600 of FIG. 10*a*, with non-adjacent resonator devices 61 and 62 illustrated. It will be appreciated that such devices 61 and 62 may be comprised of a lumped capacitive inductive element such as the element designated 20 in FIG. 3. The resonator elements 61 and 62 include an area therebetween in which a weak cross-coupling occurs due to the layout of the elements on the substrate. In order to enhance the cross-coupling, a loop device 63 is located therebetween (e.g., in the area in which no element previously resided). This closed loop enhances the cross-coupling between the devices 61 and 62. Further, because no device was previously located within that area, the additional element does not require real estate on the layout, nor does it interfere with the other devices. It will be appreciated that multiple choices of the loop could be made, including circular, rectangular, an arc, triangular and combinations thereof.

Figure 10C:
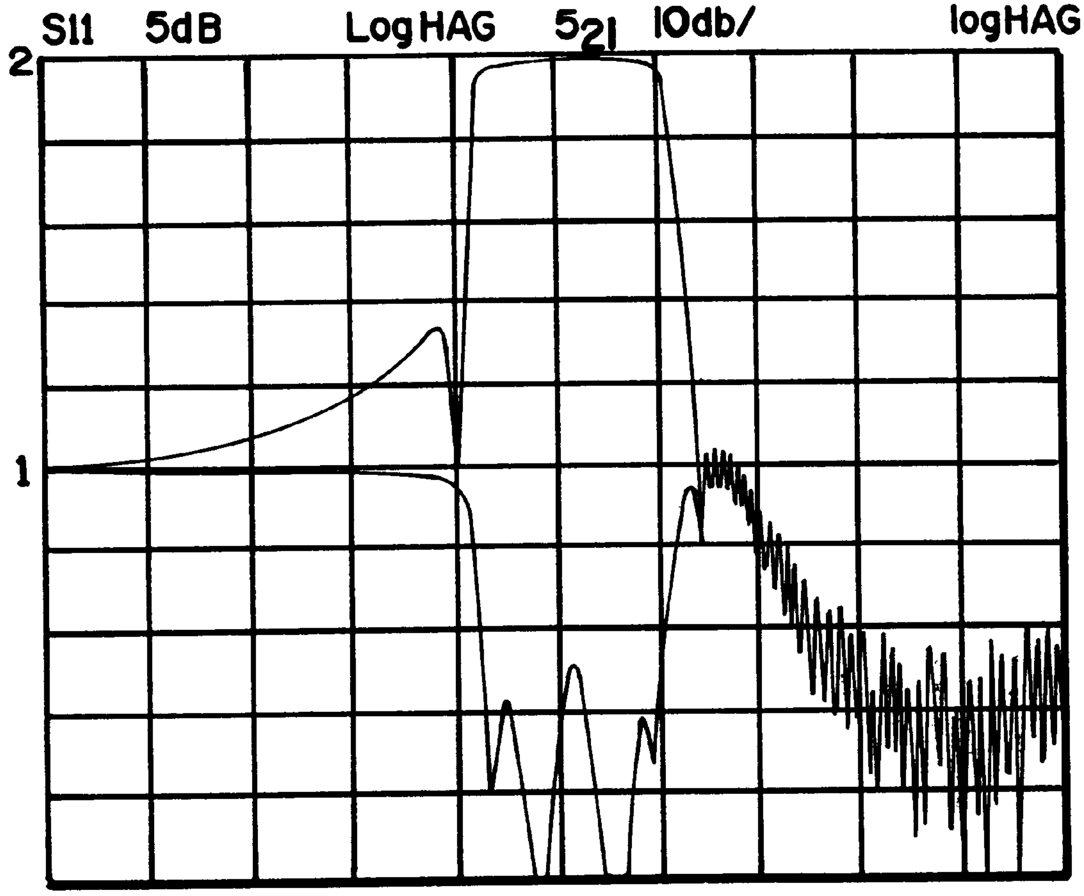
FIG. 10*c* is a graph based on measurements which illustrates the transmission response of the filter of FIG. 10*a* with a closed loop enhancement of cross-coupling to −30 dB.

FIG. 10*c* illustrates that closed loop device 63 (see FIG. 10*b*) enhances transmission zero level to −30 dB. (See the transmission loss curve $S_{21}$ in FIG. 10*c*, in which the scale is 10 dB per vertical division.) Such a filter, before using the transmission zero enhancement has a transmission level of −70dB.

Second Embodiment for Cross-Coupling of Non-Adjacent Resonators

There are some problems in the quadruplet designs discussed above. For a quadruplet section the second order cross-coupling, such as parasitic cross-coupling between resonators one and three, between resonators one and five and between resonators one and six, for example, disturbs the location of the zeros and results in an asymmetric filter. These problems are overcome with the use of an alternate embodiment, specifically, tri-section cross-coupling in High Temperature Superconductors (HTS).

Tri-section cross-coupling results when there is only one resonator between the cross-coupled non-adjacent resonators. The value of the cross-coupling in tri-section cross-coupling is much larger than that of the symmetric quadruplet and thus the effects of parasitic non-adjacent coupling can be significantly reduced. Furthermore, each zero in a filter utilizing tri-section cross-coupling is independently controlled by one cross-coupling, which provides a fundamental solution to offset the effects of parasitic non-adjacent coupling and asymmetric resonators, and thus makes HTS thin-film filters with multiple transmission zeros and symmetric frequency response possible.

Figure 11A:
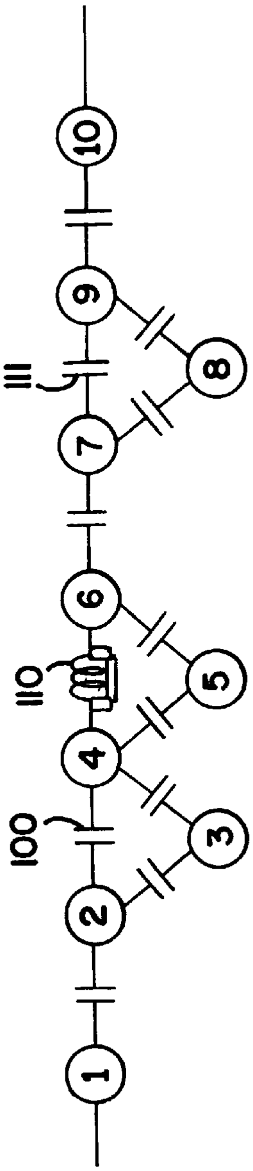
FIG. 11*a* is a schematic of a 10-pole filter with two transmission zeros on the high side and one transmission zero on the low side.
Figure 11B:
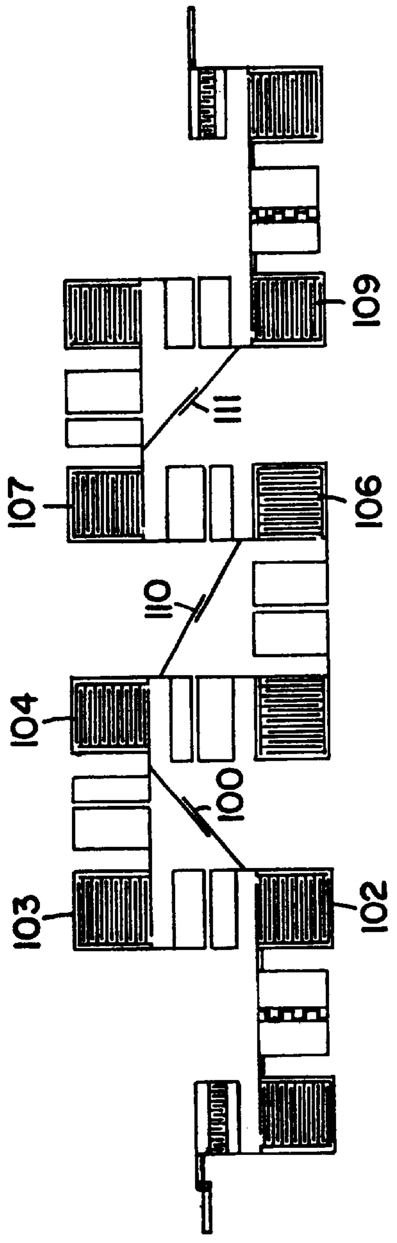
FIG. 11*b* illustrates the topology of an HTS layout of the filter shown in FIG. 11*a*.

FIGS. 11*a*, 11*b*, 12*a*, and 12*b* are exemplary schematic and topology drawings of a filter utilizing tri-section cross-coupling. FIG. 11*a* shows a 10-pole filter with two transmission zeros on the high side and one transmission zero on the low side. Each of circles with numbers inside represents a resonator. Cross-coupling element 100 couples non-adjacent resonators No. 2 and No. 4; cross-coupling element 110 couples non-adjacent resonators No. 4 and No. 6; cross-coupling element 111 couples non-adjacent resonators No. 7 and No. 9. In each case, only one other resonator exists between a pair of cross-coupled, non-adjacent resonators. For example, resonator No. 3 is the only resonator connected between cross-coupled resonators No. 2 and No. 4. FIG. 11*b* illustrates the HTS topology of the filter shown in FIG. 11*a*. In FIG. 11*b*, cross-coupling element 100 cross-couples resonator element 102 to resonator element 104. Only one resonator 103 exists between cross-coupled resonators 102 and 104. Cross-coupling element 110 cross-couples resonator 104 to resonator 106. Cross-coupling element 111 cross-couples resonator 107 to resonator 109. The schematic representations of cross-coupling elements 100, 110 and 111 are also identified in FIG. 11*a.*

Figure 12A:
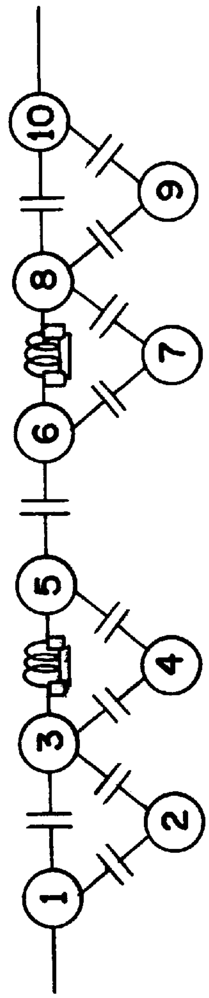
FIG. 12*a* is a schematic of a 10-pole filter with two transmission zeros on each side.
Figure 12B:
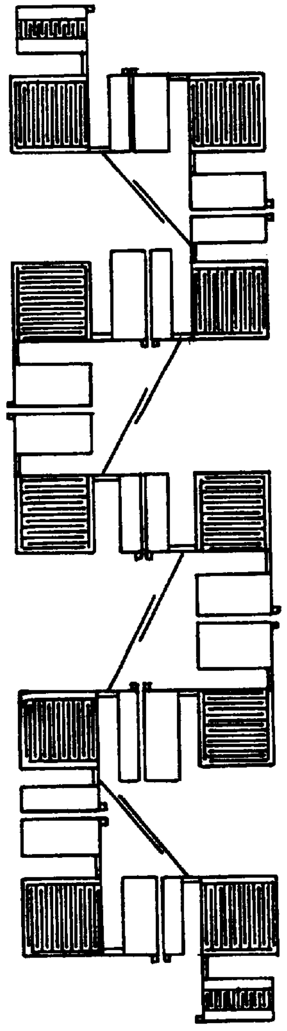
FIG. 12*b* illustrates the topology of an HTS layout of the filter shown in FIG. 12*a*.

FIG. 12*a* illustrates a 10 pole filter with two transmission zeros on each side. The cross-coupling scheme is similar to that shown in FIG. 11*a*, with cross-coupling elements 120, 122, 124 and 126 linking pairs of resonators Nos. 1 and 3, Nos. 3 and 5, Nos. 6 and 8, and Nos. 8 and 10, respectively. FIG. 12*b* illustrates the HTS topology of the filter shown in FIG. 12*a*. The resonators in FIG. 12*a* are realized by patterns 202, 203, 204, 205, 206, 207, 208, 209, 210 and 211, each including a frequency-dependent inductor and shunt capacitor pads, in FIG. 12*b*. For example, resonator No. 3 in FIG. 12*a*, is realized by the resonator 204 in FIG. 12*b*.

Figures 14A, 14B, 14C:
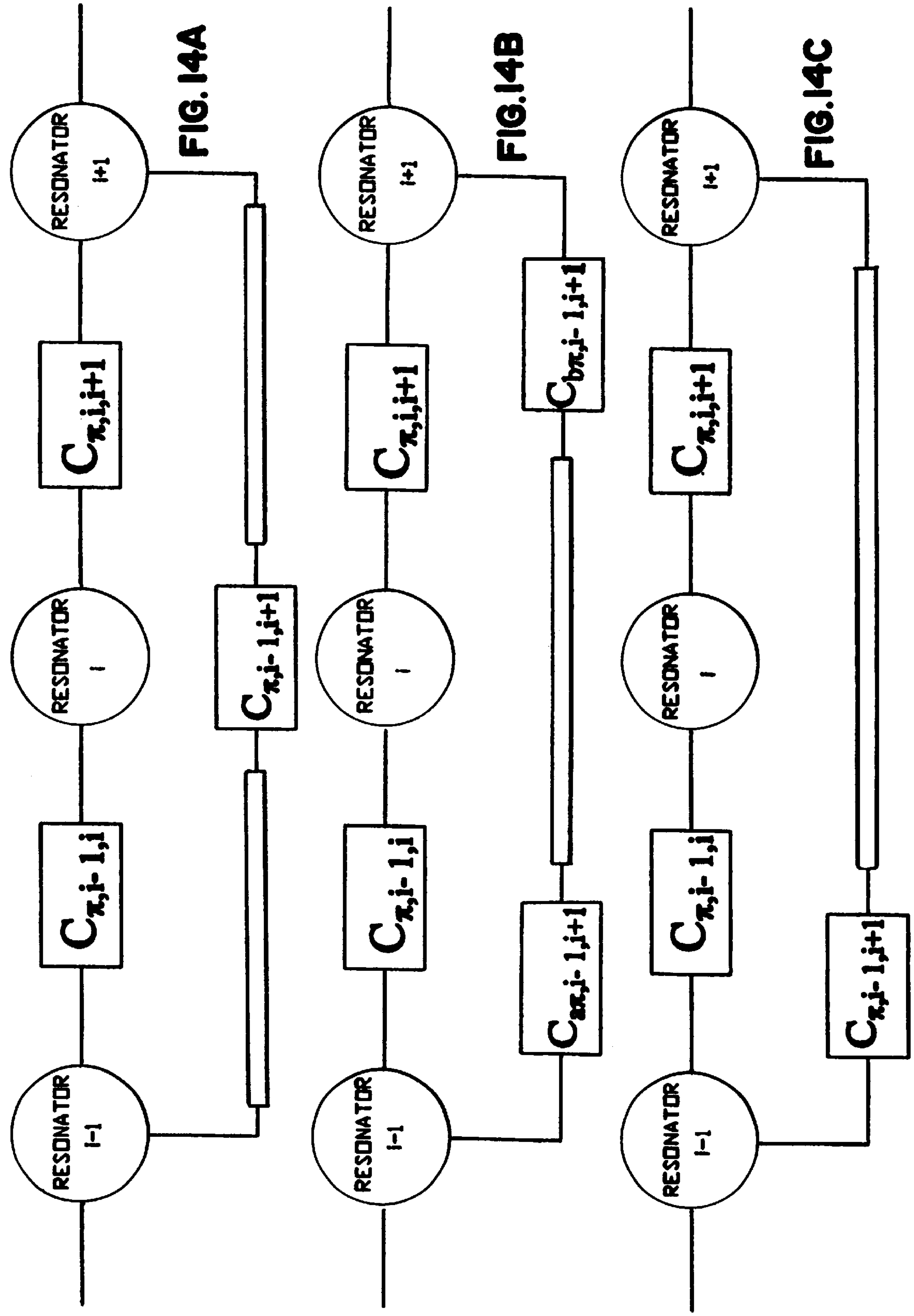
FIGS. 14*a*, 14*b* and 14*c* illustrate three possible cross-coupling structures for microstrip Pi-resonators.

FIG. 13*a* shows a tri-section with positive cross-coupling for HTS microstrip Pi-resonators realized by an ideal admittance inverter 1302 linking the resonators 1304 and 1308. FIG. 13*b* shows a similar tri-section but with negative cross-coupling for HTS microstrip Pi-resonators realized by an ideal admittance inverter 1302. A tri-section, symbolically shown in FIGS. 13*a* and 13*b* as composed of resonators i, i+1 and i+2 with a cross-coupling element $M_{i,i+2}$ between the ith and i+2nd resonators, with a positive cross-coupling element realizes a zero on the filter high side stop band, while a negative cross-coupling element implements a zero on the low side. Due to the limitations of the planar structure of microstrip circuits, an additional extension line is required for the cross-coupling design. FIGS. 14*a*, 14*b* and 14*c* show three possible configurations for the tri-section cross-coupling design for microstrip Pi-resonators. The three resonators, indexed as i−1st, ith and i+1st, respectively, are coupled in series by Pi-capacitive elements $C_{n,i-1,I}$ and $C_{n,i+1,I}$ on either side of the ith resonator. The two non-adjacent resonators (i−1st and i+1st) are cross-coupled by a cross-coupling member that includes a variety of combinations of Pi-capacitive elements and transmission lines. In FIG. 14*a*, for example, the cross-coupling member includes a Pi-capacitive element 1402 in series with transmission line segments 1404 and 1406. In FIG. 14*b*, the cross-coupling member includes two Pi-capacitive elements 1402 and 1408 in series with a transmission line segment 1404. In FIG. 14*c*, the cross-coupling member includes a Pi-capacitive element 1402 in series with a transmission line segments 1404. These coupling structures should be converted to an equivalent network that can be incorporated into the filter design.

Figure 15A:
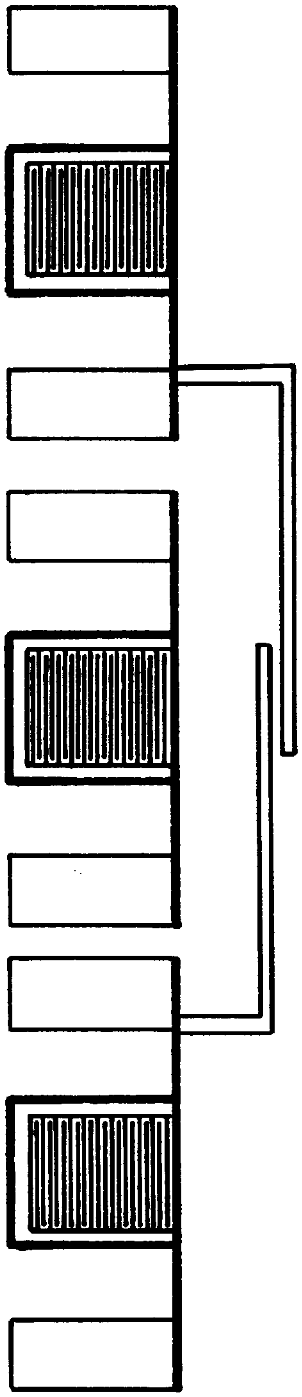
FIGS. 15*a*, 15*b* and 15*c* illustrate the physical structures of the three possible cross-coupling structures shown in FIGS. 14*a–c*, respectively.
Figure 15B:
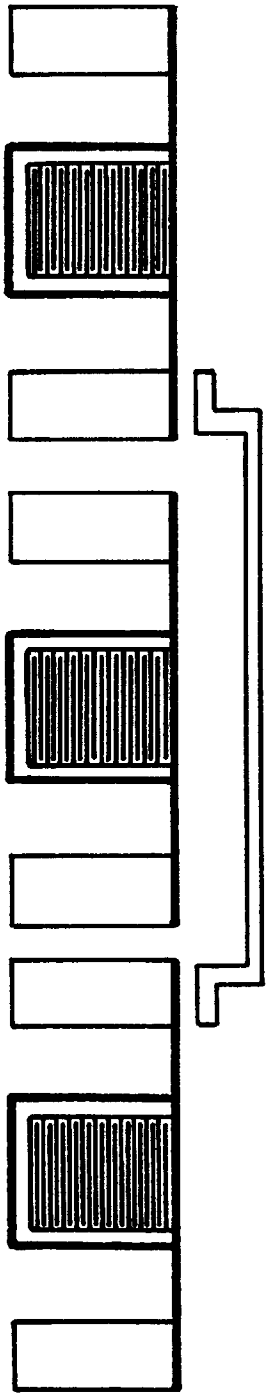
Figure 15C:
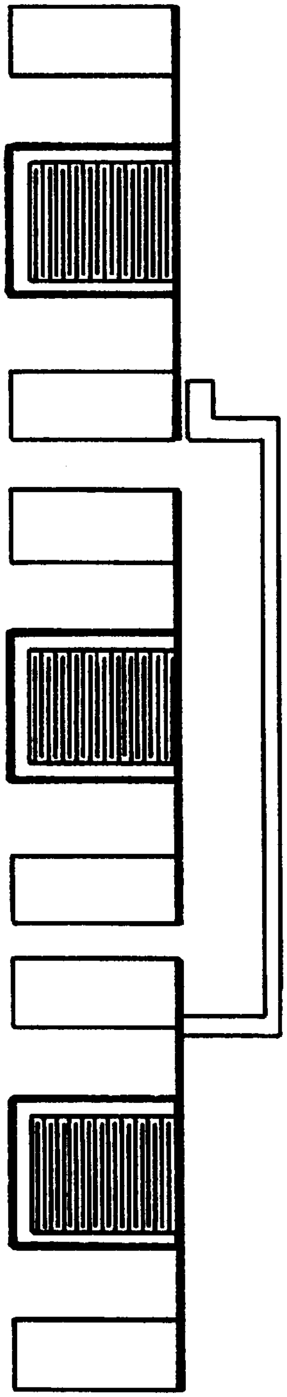

FIGS. 15*a*, 15*b* and 15*c* show three possible physical structures corresponding respectively to the structures of FIGS. 14*a*, 14*b* and 14*c*, where the patterns 1502, 1504 and 1506 correspond to their respective cross-coupling members in FIG. 14.

Figure 16C:
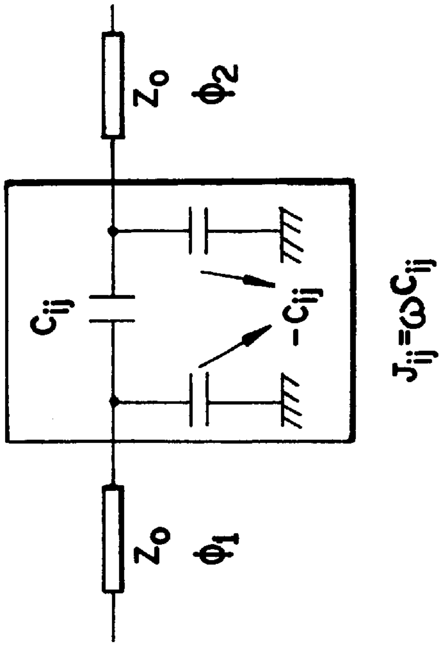
FIGS. 16*a*, 16*b* and 16*c* illustrate the conversion of a Pi-capacitor network to an ideal admittance inverter with two sections of transmission line.

The cross-coupling element can be modeled as a Pi-capacitance network if the dimension of the element is much less than the wavelength of interest (<30°). This Pi-capacitance network can be approximated by an ideal admittance inverter with additional transmission lines at its input and output for narrow band applications, as shown in FIG. 16*a* (ideal Pi capacitance network), 16*b* (equivalent circuit to FIG. 16*a*, including a admittance inverter 1602) and 16*c* (same circuit as FIG. 16*b*, with the capacitances at both ends realized by transmission lines 1604. The practical coupling structures, as shown in FIG. 14*a*, 14*b* and 14*c*, then can be transformed to the equivalent networks in FIG. 17*a*, 17*b* 17*c* respectively, where J, $J_a$ and $J_b$ are admittance inverters 1704 in FIG. 17*a*, 1706 and 1708 in FIG. 17*b*, and 1710 in FIG. 17*c*. The equivalent network in FIG. 17*a, b* and *c* can be transformed to the equivalent network in FIG. 17*d*, in which $J_{eff}$ denotes an effective admittance inverter 1712 and $B_1$ and $B_2$ are suseptances 1714. The procedure is to compute the [ABCD] matrix of each network by cascading that of the individual section (i.e. inverter, transmission line or shunted admittance) and match that of the network in FIG. 17*d*. The results are summarized as followings:From FIG. 17*a* to FIG. 17*d*

$$J_{eff}=1/\left(-J\sin^2\frac{\theta_c}{2}/Y_c^2+\cos^2\frac{\theta_c}{2}/J\right);$$

$$B=\sin\frac{\theta_c}{2}\cos\frac{\theta_c}{2}(J/Y_c+Y_c/J)/\left(-J\sin^2\frac{\theta_c}{2}/Y_c^2+\cos^2\frac{\theta_c}{2}/J\right);$$

Figure 17A:
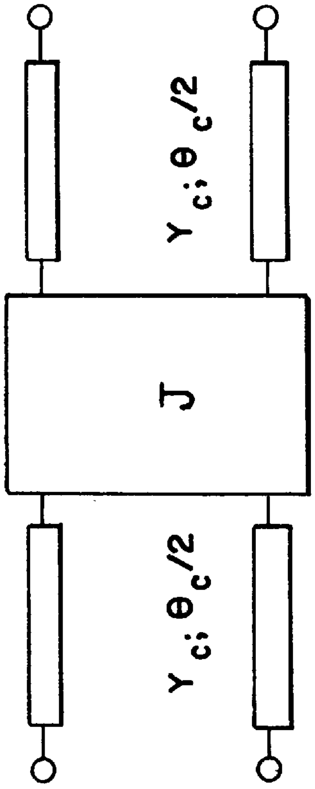
FIG. 17*a* illustrates the equivalent network that can be used for the practical cross-coupling structure in FIG. 14*a*.
Figure 17B:
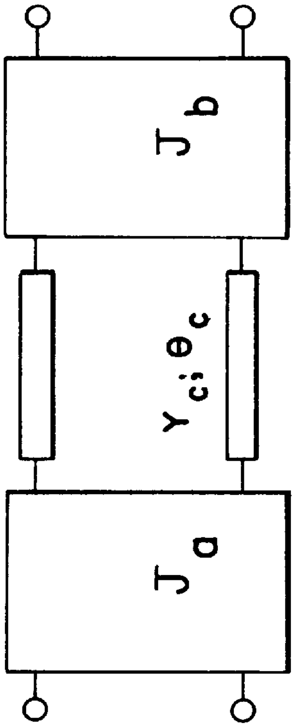
FIG. 17*b* illustrates the equivalent network that can be used for the practical cross-coupling structure in FIG. 14*b*.
Figure 17C:
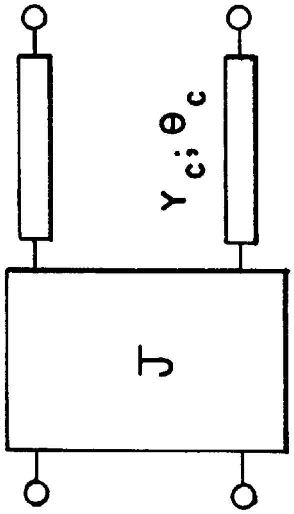
FIG. 17*c* illustrates the equivalent network that can be used for the practical cross-coupling structure in FIGS. 14*b* and 14*c*.
Figure 17D:
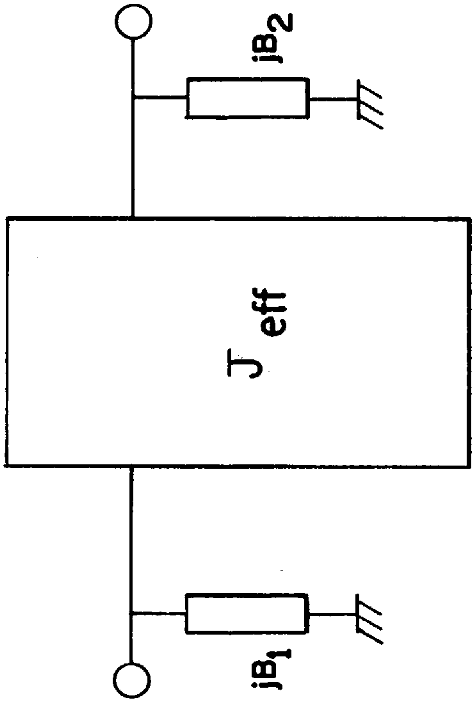
FIG. 17*d* illustrates an equivalent network transformed from the equivalent networks of FIGS. 17*a*, 17*b* and 17*c*.

From FIG. 17*b* to FIG. 17*d*

$$J_{eff}=\frac{J_aJ_b}{Y_c\sin\theta_c};$$

$$B_1=-J_{eff}(J_a/J_b)\cos\theta_c=-\frac{J_a^2}{Y_c}\cot\theta;$$

$$B_2=-J_{eff}(J_b/J_a)\cos\theta_c=-\frac{J_b^2}{Y_c}\cot\theta;$$

Assume the susceptance slope parameter of the resonator is b, the coupling k between the resonators and the shunt susceptances can be expressed as:

$$k = \frac{1}{\sqrt{Q_a Q_b}\sin\theta_c} = \frac{\sqrt{g_a g_b}}{\sin\theta_c};$$

$$\frac{B_1}{b} = \frac{\cot\theta_c}{Q_a};$$

$$\frac{B_2}{b} = \frac{\cot\theta_c}{Q_b};$$

where $Q_a$ and $Q_b$ are the external Q looking into resonators from transmission line $Y_c$, $g_a$ and $g_b$ are the input admittance (which is normalized to b) of $Y_c$ presented to resonator from coupling (by inverter) respectively.

From FIG. 17*c* to FIG. 17*d*

$$J_{eff} = \frac{J}{\cos\theta_c};$$

$$B_1 = \frac{-J_2^2}{Y_C}\tan\theta_C;$$

$$B_2 = -Y_C\tan\theta_C$$

The filter design/synthesis procedure for filters utilizing tri-section cross-coupling is very similar to the case of all-pole filters, as shown in "Direct synthesis of tubular bandpass filters with frequency-dependent inductors," by Qiang Haung, Ji-Fuh Liang, Dawei Zhang and Guo-Chun Liang, in 1998 IEEE Int. Microwave Symp. Dig., June 1992. It is summarized as follows:

1. Use the coupled resonator analysis/synthesis technique to obtain the required coupling matrix for a specific frequency response requirement, 2. Choose a proper inductor L(w) which can be frequency dependent,
3. Follow the procedure in the article "Direct synthesis of tubular bandpass filters with frequency-dependent inductors," to obtain the LC values of the resonators and adjacent coupling capacitance,
4. Choose the cross-coupling structure and compute the non-adjacent coupling capacitance
5. Absorb the parasitic capacitances by nearby resonators
6. Use the above results to construct the LC filter network and compute the filter response.
7. Fine-adjust the non-adjacent coupling capacitances to relocate the transmission zeros if necessary. Optimization can be revoked to restore the return loss.

It is not surprising to find that the initial response of the design, from step 1 to 6, usually has some discrepancy with respect to the original response given by the ideal coupled resonator model. The major contributor is that the derived formula in "Direct synthesis of tubular bandpass filters with frequency-dependent inductors," to compute the coupling is a narrow band approximation and the frequency dependence of the inductor is not taken into account. However, the initial response is close enough to the optimized one and tuning/optimization can be used to restore the response without any trouble.

It is worthwhile to note that the effort to reduce this effect on thin-film circuits still needs to be emphasized. The choice of substrate material, resonator structures and careful layouts are the major factors in determining the strength of the parasitic coupling.

Provided below are working examples of filters utilizing the concept of tri-section resonators in HTS.

EXAMPLE I

6-pole Quasi-elliptic Function Filter

Figure 18B:
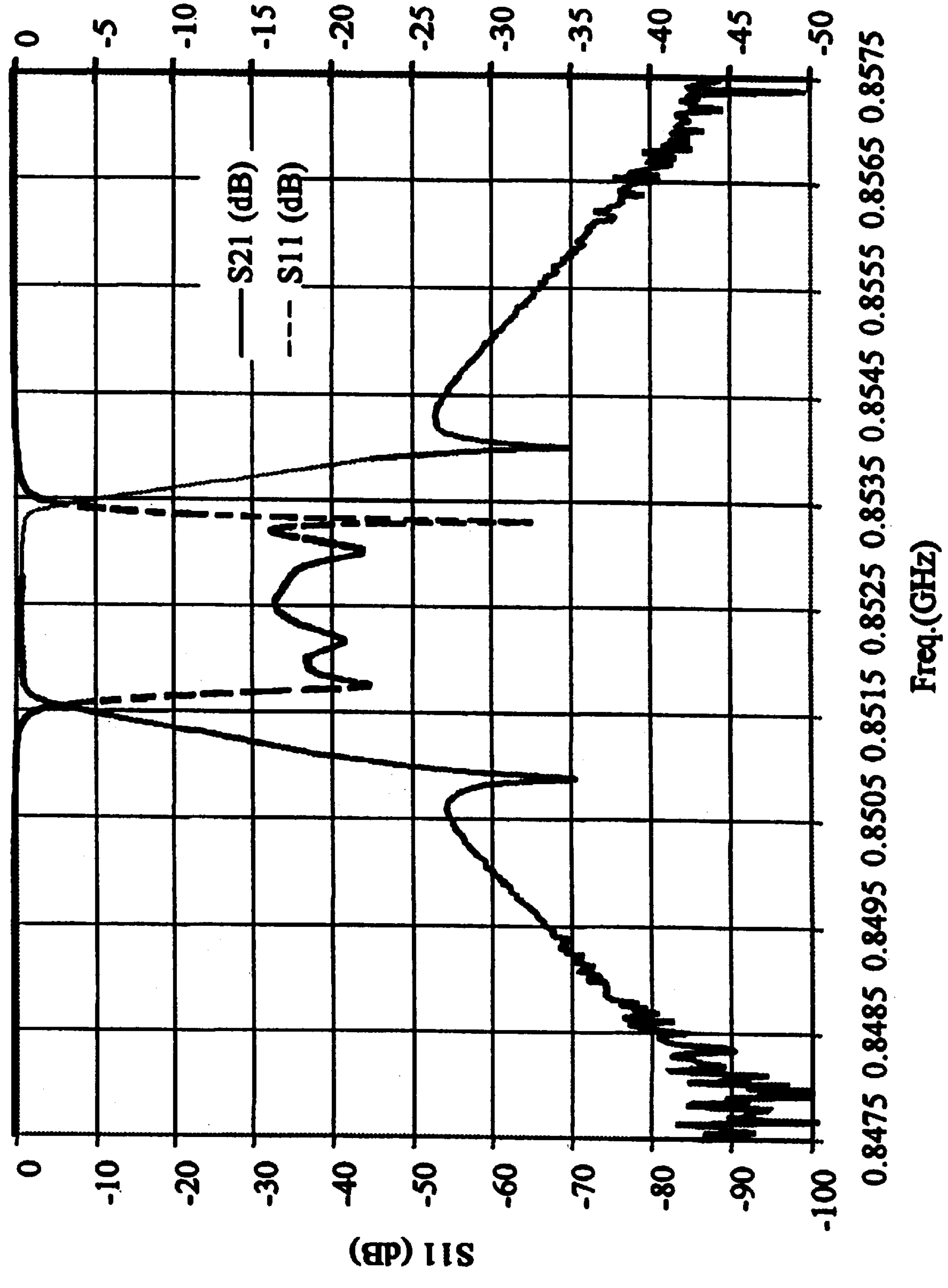
FIG. 18*b* is a graph based on measurements which illustrate the transmission response of the filter of FIG. 18*a*.

FIG. 18*a* shows the schematic of a 6-pole quasi-elliptic function filter with one transmission zeros on each side of the stop band. The measured filter response is shown in FIG. 18*b*. (In FIGS. 18*b*, 19*b*, 19*c* and 20*b*, the filter responses are represented in terms of transmission loss and return loss. Transmission loss is plotted in solid line and labeled $S_{21}$; return loss is plotted in dotted line and labeled $S_{11}$.) The circles with numbers in them in FIG. 18*a* (as well as in FIGS. 19*a*, 20*a*, 21*a* and 21*b*) represent the resonators. The "+" sign indicates positive coupling and the "−" sign indicates positive coupling. The coupling of resonator 1 to resonator 3 is implemented by direct coupling of the shunt capacitor of the Pi-resonators, while the negative cross-coupling of resonator 4 to resonator 6 is implemented by the structure shown in FIG. 14*c*. This example and others are all based on a 20-mil-thick LAO ($e_r$=24.0) substrate.

EXAMPLE II

10-pole Filters with Symmetric and Asymmetric Transmission Zeros

Figure 19B:
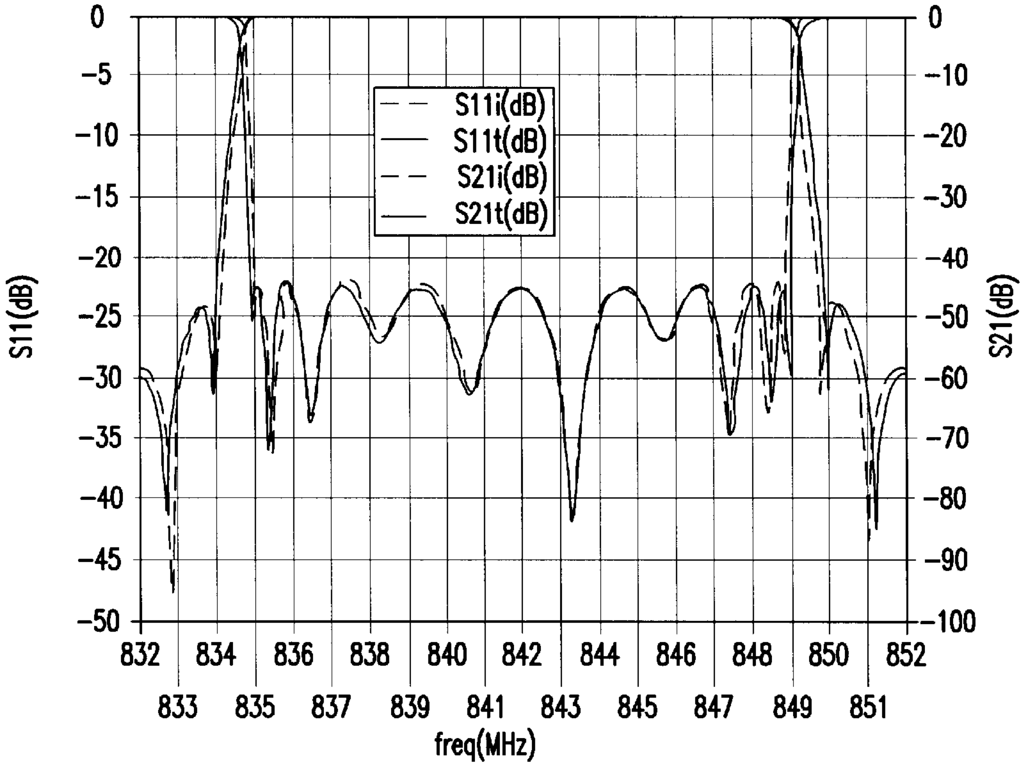
FIG. 19*b* is a graph showing the simulated transmission response of the filter of FIG. 19*a*.
Figure 19C:
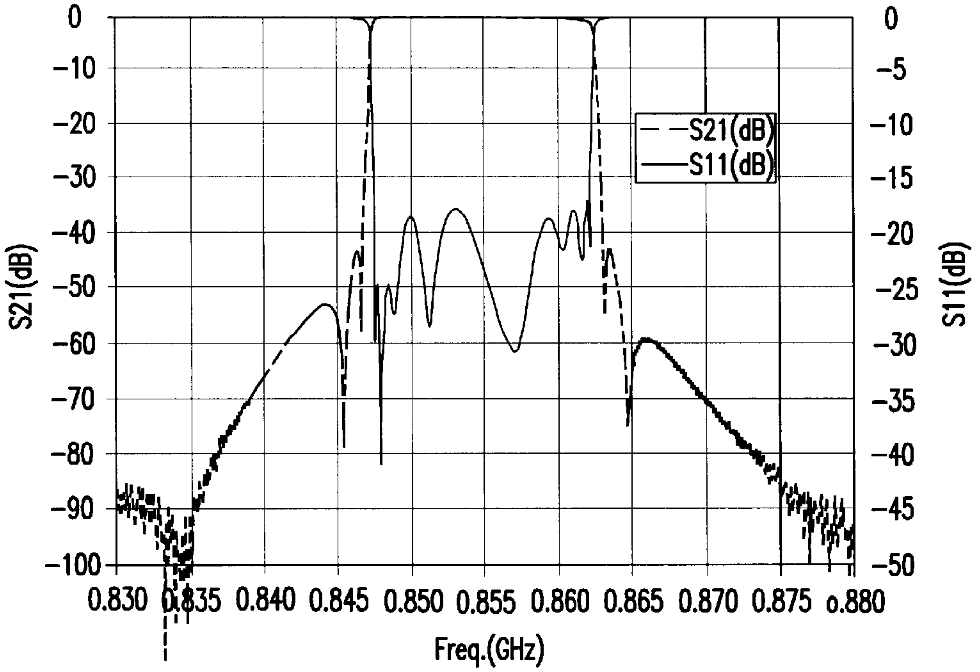
FIG. 19*c* is a graph based on measurements which illustrate the transmission response of the filter of FIG. 19*a*.
Figure 20A:
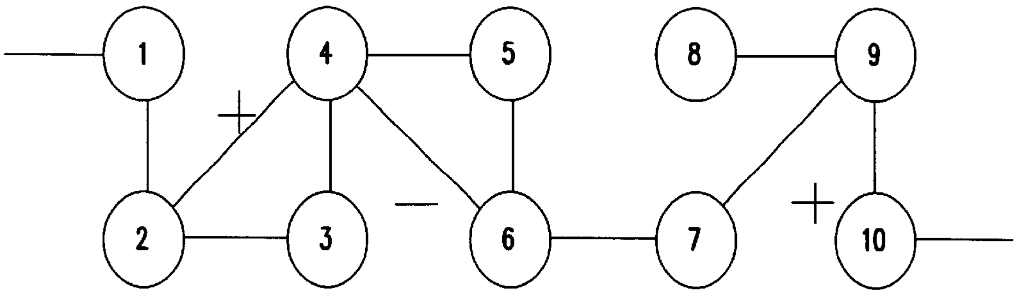
FIG. 20*a* illustrates the cross-coupling scheme of a 10-pole asymmetric filter.
Figure 20B:
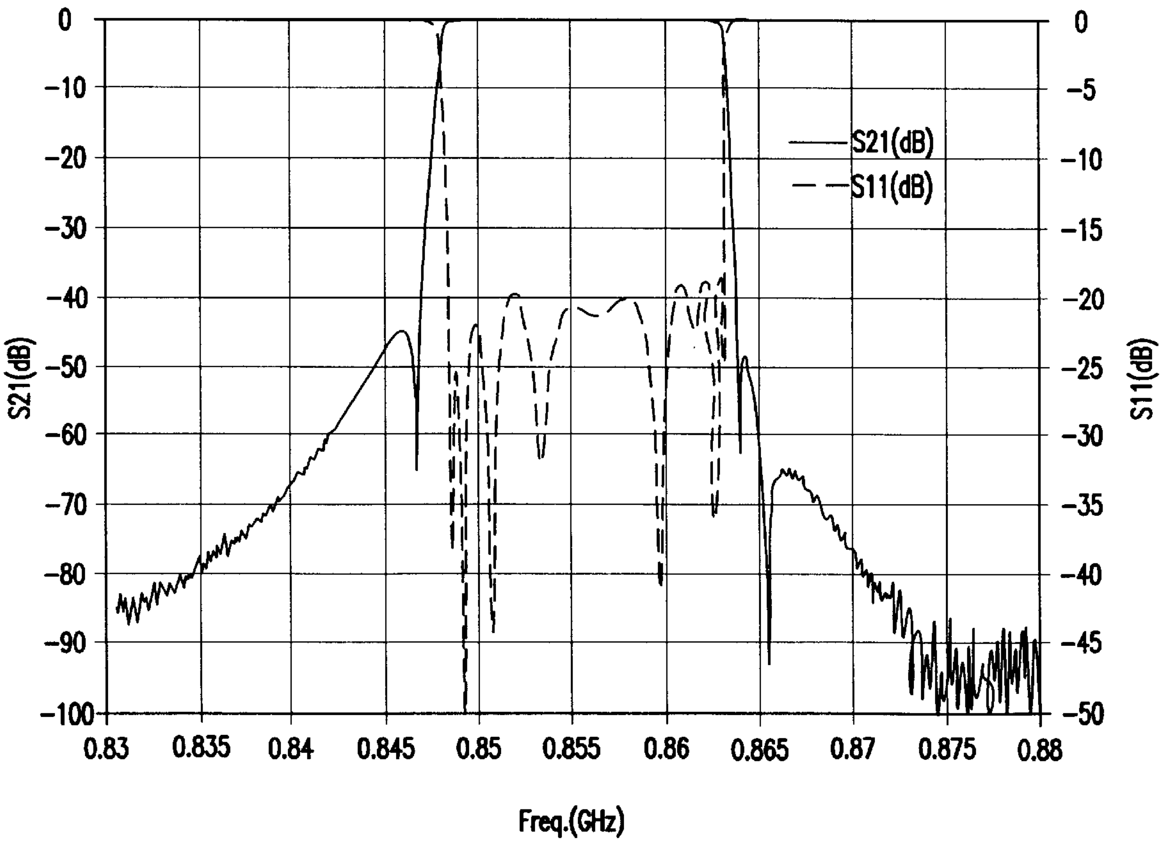
FIG. 20*b* is a graph based on measurements which illustrate the transmission response of the filter of FIG. 20*a*.

The cross-coupling scheme, simulated responses and measured data of a 10-pole quasi-elliptic function filter with two transmission zeros on each side are shown in FIGS. 19*a*, 19*b* and 19*c*, respectively. There are two simulated responses in FIG. 19*b*, one from the LC model, the other from the cascading of the computed scattering matrix of the individual physical structures. For the measured response in FIG. 19*c*, there is a additional zero on the low side, which is due to the parasitic cross-coupling of the microstrip resonator. In this case, it does not significantly affect the rejection slope of the filter. Otherwise, slightly adjusting the cross-coupling can restore the symmetry of the rejection skirt on the pass band edge. The cross-coupling scheme and measured response of a 10-pole filter, with two zeros on the high side and one zero on the low side of the stop band are shown in FIGS. 20*a* and 20*b* respectively.

EXAMPLE III

6-pole Quasi-elliptic Function Filter Based on Asymmetric Pi-resonators Using (a) a Quadruplet Section and (b) Two Tri-sections The capacitor-loaded inductor of the HTS lumped element resonator used to construct the filter has a resonant frequency which is higher than the filter center frequency and produces a transmission zero on the high side of the filter stop band. Thus, the response of the resonator is asymmetric with respect to the filter center frequency.

Figure 21A:
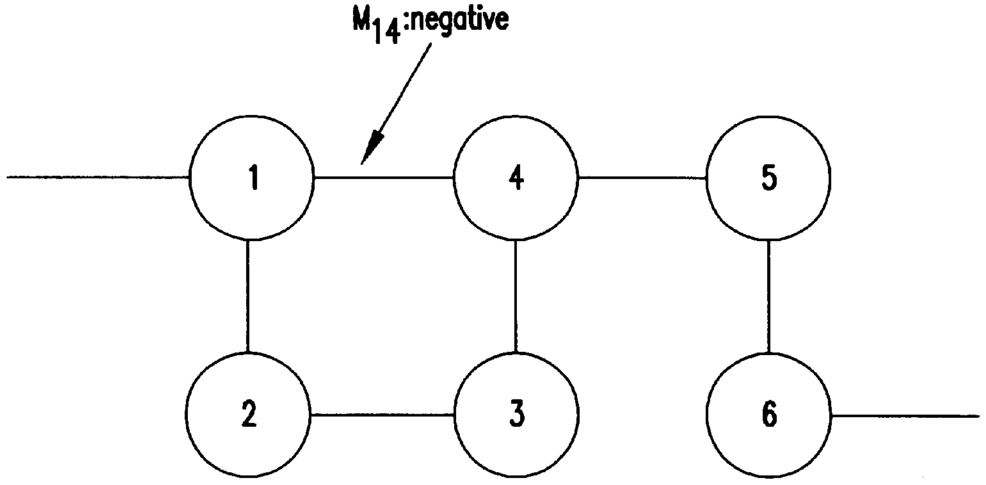
FIG. 21*a* illustrates the cross-coupling scheme of a 6-pole quasi-elliptic function filter realized by quadruplet.
Figure 21B:
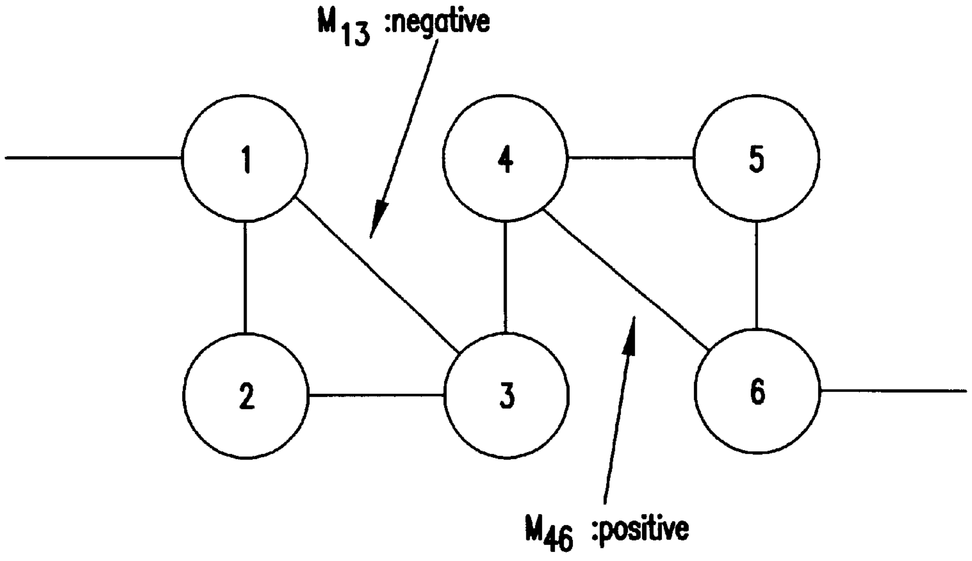
FIG. 21*b* illustrates the cross-coupling scheme of a 6-pole quasi-elliptic function filter realized by a trisection.
Figure 22:
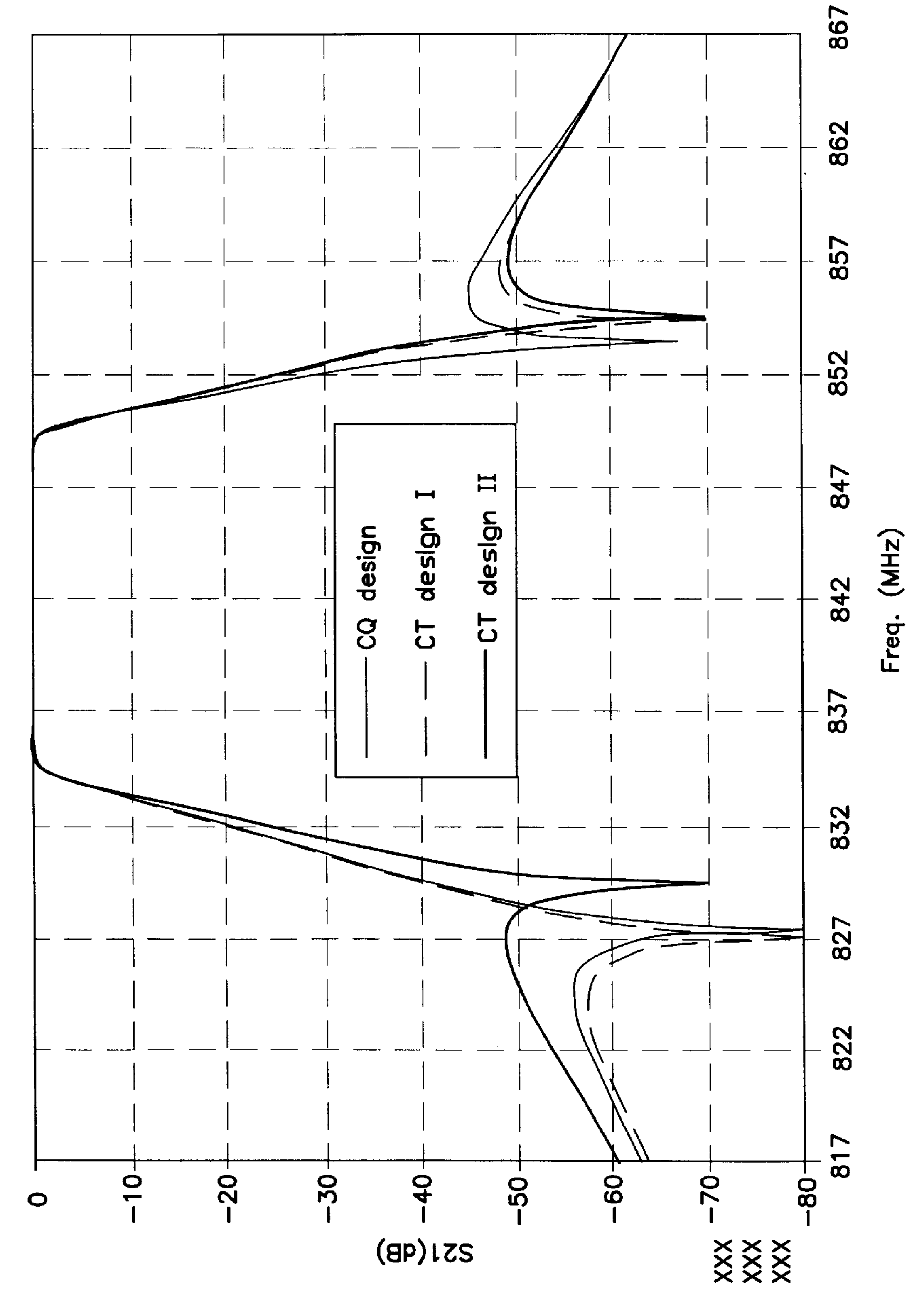
FIG. 22 is a graph showing the transmission response of the filters of FIG. 21*a*, FIG. 21*b* and of a tri-section with fine adjusted cross-coupling.

Due to the asymmetric nature of this resonator, a quadruplet section for symmetric transmission realization will result in an asymmetric rejection skirt. FIG. 21*a* illustrates a 6-pole filter using a quadruplet section. FIG. 21*b* illustrates a 6-pole filter using two tri-sections to implement a single transmission zero in each stop band. It is found that the filter response of the initial design is not symmetric with either quadruplet (CQ design) or CT-I (Tri-sections design I, which is directly converted from the ideal coupling matrix) approach. However, the cross-coupling of the CT-I design can be adjusted (and is denoted as design CT-II) to relocate the transmission zeros to restore the symmetry of the response. The responses of the filter by a quadruplet, CQ, and tri-sections, CT-I and CT-II are shown in FIG. 22. Similar principles can be applied to correct the filter's rejection deviation from the design response due to parasitic or non-ideal non-adjacent coupling.

As will be apparent to those of skill in the art, the principles of this style of cross-coupling may also be used in environments in which frequency transformation elements are not employed (e.g., a lumped element filter).

It will be appreciated, that the principles of this invention apply to control cross-coupling between non-adjacent resonant devices in order to improve filter performance. In the examples provided herein, this is accomplished by adding either inductive or capacitive elements. The examples also illustrate that the control may be based on the substrates utilized.

It is to be understood that even though numerous characteristics and advantages of the present invention have been set forth in the foregoing description, together with details of the structure and function of the invention, the disclosure is illustrative only and changes may be made in detail. Other modifications and alterations are well within the knowledge of those skilled in the art and are to be included within the broad scope of the appended claims.

What is claimed is:

1. A filter for an electrical signal, comprising:

a. at least three resonator devices in a micro-strip topology, wherein there are at least one pair of non-adjacent resonator devices; and b. a cross-coupling control element between the at least one pair of non-adjacent resonator devices, wherein the at least three resonator devices are substantially coplanar with each other and define a footprint on a substrate, and wherein the cross-coupling control element is coplanar with the resonator devices and is formed on the substrate and located substantially within the footprint.

2. The filter of claim 1, wherein the micro-strip topology includes a dielectric substrate of either MgO, $LaAlO_3$, $Al_2O_3$, or YSZ.

3. The filter of claim 2, wherein each of the at least three resonator devices comprises a superconductive material.

4. The filter of claim 1, wherein each of the at least three resonator devices comprises a superconductive material.

5. The filter of claim 1, wherein the cross-coupling control element includes a capacitive element located between the pair of non-adjacent resonator devices.

6. The filter of claim 1 wherein only one other resonator device is placed between the at least one pair of non-adjacent resonator devices.

7. The filter of claim 1, wherein each of the at least three resonator devices comprises a capacitively-loaded inductor that comprises an interdigitized capacitor.

8. The filter of claim 7, wherein the cross-coupling control element includes a capacitive element located between the pair of non-adjacent resonator devices.

9. The filter of claim 7, wherein the cross-coupling element includes a loop element located between the pair of non-adjacent resonator devices.

10. The filter of claim 9, wherein the loop element is an inductive loop which passes proximate each of the pair of non-adjacent resonator devices.

11. The filter of claim 7, wherein the micro-strip topology includes a dielectric substrate of either MgO, $LaAlO_3$, $Al_2O_3$, or YSZ.

12. The filter of claim 7, wherein each of the at least three resonator devices comprises a superconductive material.

13. The filter of claim 1, wherein the cross-coupling element includes a loop element located between the pair of non-adjacent resonator devices.

14. The filter of claim 13, wherein the loop element is an inductive loop which passes proximate each of the pair of non-adjacent resonator devices.

15. A bandpass filter, comprising:

a. at least three L-C filter elements, each of said L-C filter elements comprising an inductor and a capacitor in parallel with the inductor;

b. a plurality of Pi-capacitive elements interposed between the L-C filter elements, wherein a lumped-element filter is formed with at least two of the L-C filter elements being non-adjacent one another;

c. means for controlling cross-coupling between the non-adjacent L-C filter elements, wherein a quasi-elliptical filter transmission response is achieved, wherein the at least three L-C filter elements are substantially coplanar with each other and define a footprint on a substrate, and wherein the cross-coupling control means is coplanar with the L-C filter elements and is formed on the substrate and located substantially within the footprint.

16. The filter of claim 15, wherein each of the at least three L-C filter elements comprises a superconductive material.

17. The filter of claim 15 wherein only one other L-C filter element is placed between the at least two L-C filter elements.

18. The filter of claim 15, wherein the inductor and capacitor connected in parallel in each of the at least three L-C filter elements form a capacitively-loaded inductor that comprises an interdigitized capacitor.

19. The filter of claim 18, wherein the L-C filter elements includes a dielectric substrate of either MgO, $LaAlO_3$, $Al_2O_3$, or YSZ.

20. The filter of claim 18, wherein each of the at least three L-C filter elements comprises a superconductive material.

21. The filter of claim 15, wherein the L-C filter elements includes a dielectric substrate of either MgO, $LaAlO_3$, $Al_2O_3$, or YSZ.

22. The filter of claim 21, wherein each of the at least three resonator devices comprises a superconductive material.

23. A filter for an electrical signal, comprising:

a. at least three resonator devices in a micro-strip topology, wherein there are at least one pair of non-adjacent resonator devices; and b. a cross-coupling control element between the at least one pair of non-adjacent resonator devices, wherein the at least three resonator devices are substantially coplanar with each other and form a zig-zag pattern, which define a footprint on a substrate, and wherein the cross-coupling control element is coplanar with the resenator devices and is located substantially within the footprint.

24. The filter of claim 23 wherein only one other resonator device is placed between the at least one pair of non-adjacent resonator devices.

25. The filter of claim 23, wherein each of the at least three resonator devices comprises a capacitively-loaded inductor that comprises an interdigitized capacitor.

* * * * *

UNITED STATES PATENT AND TRADEMARK OFFICE
CERTIFICATE OF CORRECTION

PATENT NO. : 6,529,750 B1
DATED : March 4, 2003
INVENTOR(S) : Zhang et al.

It is certified that error appears in the above-identified patent and that said Letters Patent is hereby corrected as shown below:

<u>Drawings,</u>
Figure 2, replace "L(W)" with -- L'(W) --

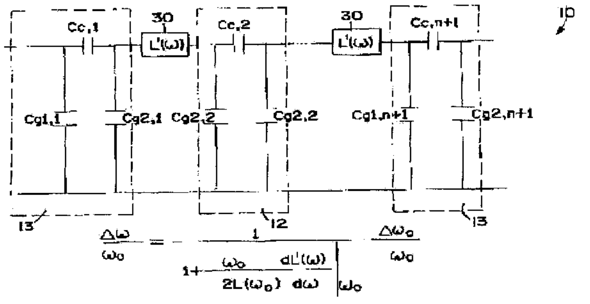

FIG. 2

Figure 6, delete ref. nos. 1-12,

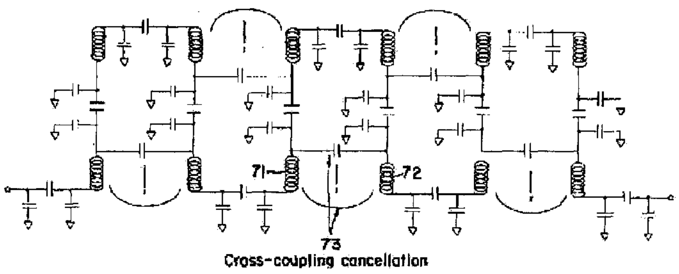

FIG. 6

Figure 7A, add ref nos. 71, 72, 73, 700, 710 and 720

FIG. 7A

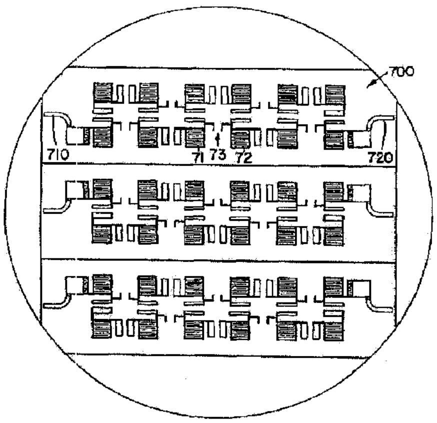

UNITED STATES PATENT AND TRADEMARK OFFICE
CERTIFICATE OF CORRECTION

PATENT NO. : 6,529,750 B1 
DATED : March 4, 2003
INVENTOR(S) : Zhang et al.

It is certified that error appears in the above-identified patent and that said Letters Patent is hereby corrected as shown below:

Figure 9, add ref. nos. 73, 900, 910 and 920

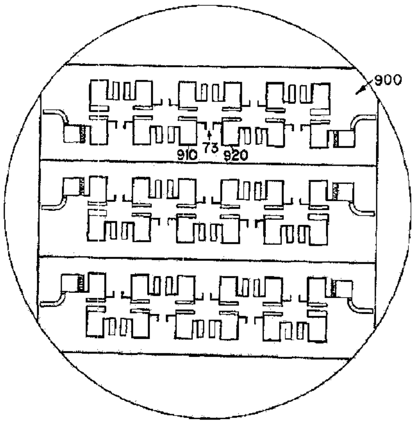

FIG. 9

Figure 10A, add ref. nos. 61-63 and 600

FIG. 10A

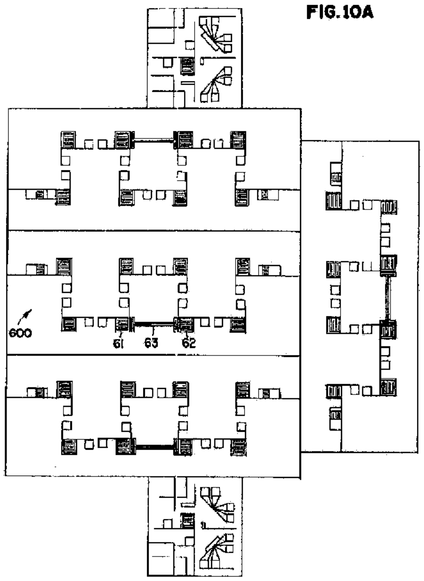

UNITED STATES PATENT AND TRADEMARK OFFICE
CERTIFICATE OF CORRECTION

PATENT NO. : 6,529,750 B1 
DATED : March 4, 2003
INVENTOR(S) : Zhang et al.

It is certified that error appears in the above-identified patent and that said Letters Patent is hereby corrected as shown below:

Figure 10B, add ref. No. 600

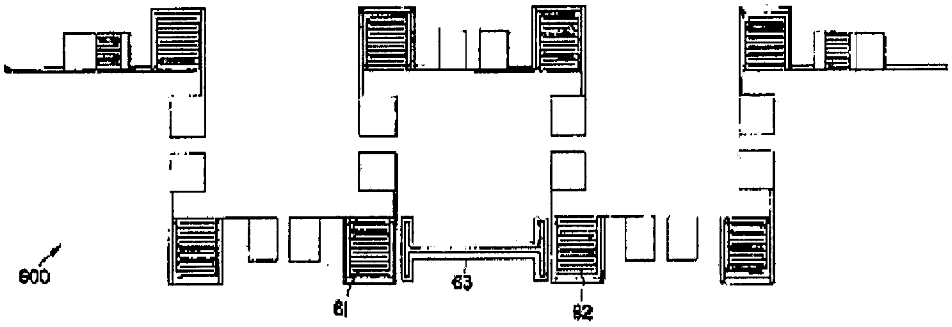

FIG. 10B

Figure 10C, "$5_{21}$" should read -- $S_{21}$ --

FIG.10C

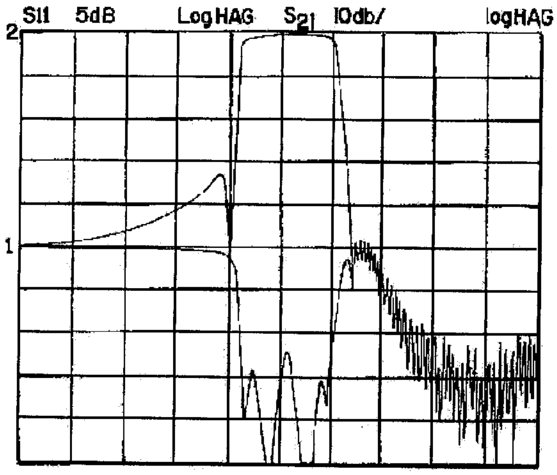

UNITED STATES PATENT AND TRADEMARK OFFICE
CERTIFICATE OF CORRECTION

PATENT NO. : 6,529,750 B1 
DATED : March 4, 2003
INVENTOR(S) : Zhang et al.

It is certified that error appears in the above-identified patent and that said Letters Patent is hereby corrected as shown below:

Figure 14A, add ref. nos. 1402, 1404 and 1406
Figure 14B, add ref. nos. 1402, 1404 and 1408
Figure 14C, add ref. nos. 1402 and 1404

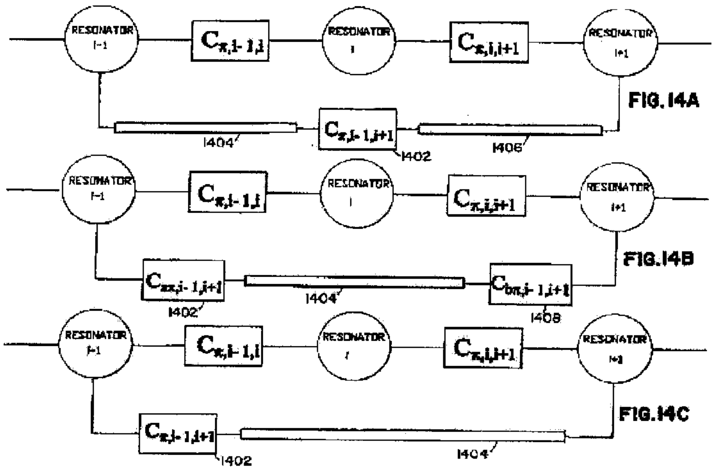

Figure 15A, add ref. no. 1502

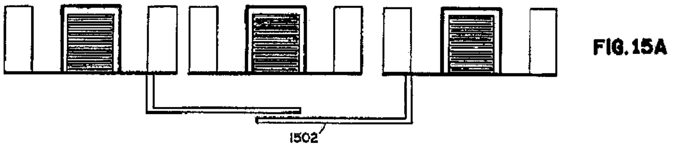

Figure 15B: add ref no. 1504

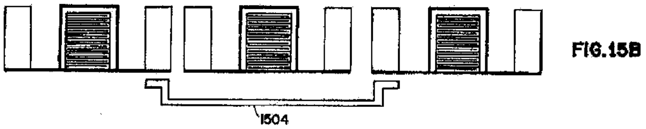

Figure 15C: add ref no. 1506

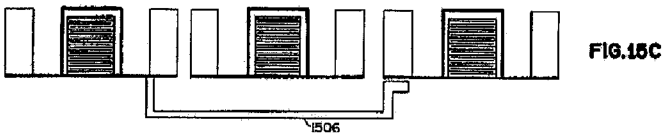

CERTIFICATE OF CORRECTION

PATENT NO. : 6,529,750 B1
DATED : March 4, 2003
INVENTOR(S) : Zhang et al.

Figure 16B:
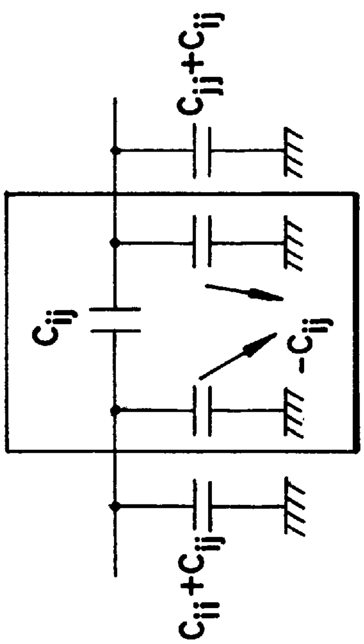
Figure 16A:
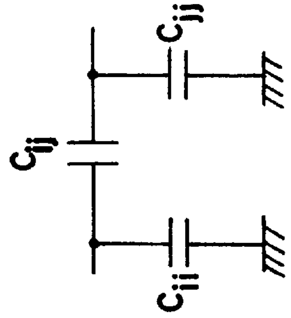

It is certified that error appears in the above-identified patent and that said Letters Patent is hereby corrected as shown below:

Figure 16B, add ref. no. 1602

FIG.16B

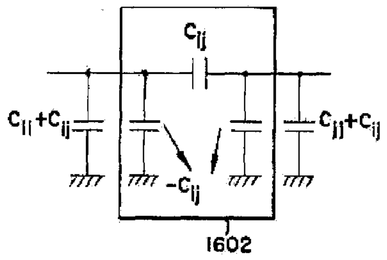

Figure 16C, add ref. nos 1602 and 1604

FIG.16C

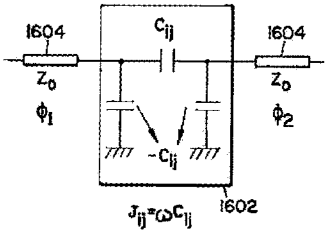

Figure 17A, add ref. no. 1704

FIG.17A

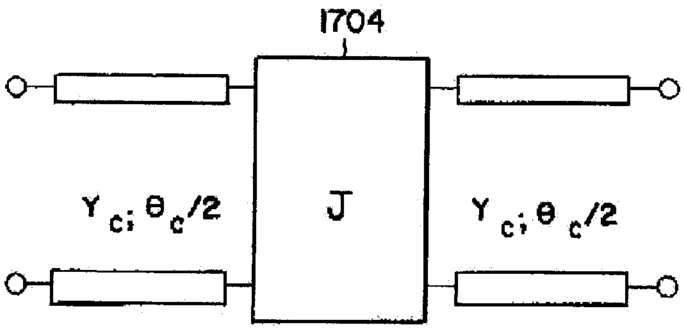

UNITED STATES PATENT AND TRADEMARK OFFICE
CERTIFICATE OF CORRECTION

PATENT NO. : 6,529,750 B1
DATED : March 4, 2003
INVENTOR(S) : Zhang et al.

It is certified that error appears in the above-identified patent and that said Letters Patent is hereby corrected as shown below:

Figure 17B, add ref. nos. 1706 and 1708

FIG.17B

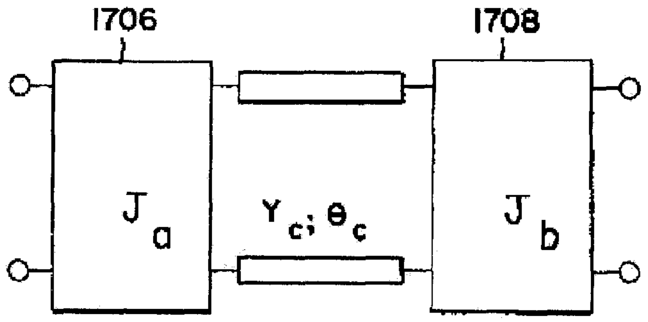

Figure 17C, add ref. no. 1710

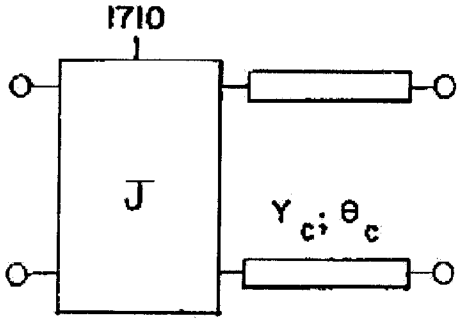

FIG.17C

UNITED STATES PATENT AND TRADEMARK OFFICE
CERTIFICATE OF CORRECTION

PATENT NO. : 6,529,750 B1
DATED : March 4, 2003
INVENTOR(S) : Zhang et al.

It is certified that error appears in the above-identified patent and that said Letters Patent is hereby corrected as shown below:

Figure 17D, add ref. nos. 1712 and 1714 (1714 has two occurrences)

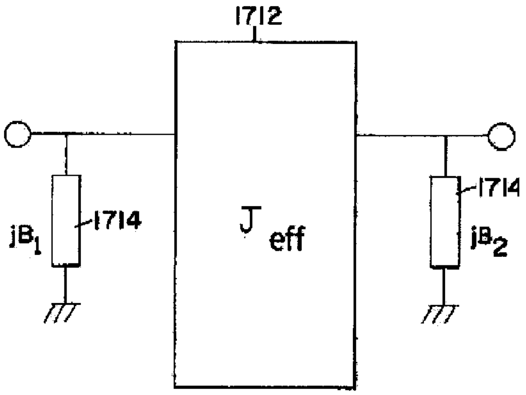

FIG.17D

Signed and Sealed this

Ninth Day of March, 2004

JON W. DUDAS
*Acting Director of the United States Patent and Trademark Office*